(12) United States Patent
Suzuki et al.

(10) Patent No.: US 12,243,897 B2
(45) Date of Patent: Mar. 4, 2025

(54) SOLID-STATE IMAGING APPARATUS, IMAGING APPARATUS, AND IMAGING SYSTEM

(71) Applicant: SONY SEMICONDUCTOR SOLUTIONS CORPORATION, Kanagawa (JP)

(72) Inventors: Misao Suzuki, Kanagawa (JP); Kiyoshige Tsuji, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 301 days.

(21) Appl. No.: 17/790,540

(22) PCT Filed: Dec. 23, 2020

(86) PCT No.: PCT/JP2020/048291
§ 371 (c)(1),
(2) Date: Jul. 1, 2022

(87) PCT Pub. No.: WO2021/140920
PCT Pub. Date: Jul. 15, 2021

(65) Prior Publication Data
US 2023/0071949 A1 Mar. 9, 2023

(30) Foreign Application Priority Data
Jan. 8, 2020 (JP) ................ 2020-001209

(51) Int. Cl.
*H01L 27/146* (2006.01)
*H04N 25/63* (2023.01)
(Continued)

(52) U.S. Cl.
CPC .. *H01L 27/14636* (2013.01); *H01L 27/14612* (2013.01); *H01L 27/14632* (2013.01);
(Continued)

(58) Field of Classification Search
None
See application file for complete search history.

(56) References Cited

U.S. PATENT DOCUMENTS 5,675,149 A * 10/1997 Wood ............... H04N 23/58
348/E3.01
10,056,423 B1 * 8/2018 Huang ............... H01L 31/105
(Continued)

FOREIGN PATENT DOCUMENTS

JP 2008-182020 8/2008
JP 2008-236158 10/2008
(Continued)

OTHER PUBLICATIONS

International Search Report and Written Opinion prepared by the Japan Patent Office on Mar. 4, 2021, for International Application No. PCT/JP2020/048291, 3 pgs.

*Primary Examiner* — Mark T Monk
(74) *Attorney, Agent, or Firm* — SHERIDAN ROSS P.C.

(57) ABSTRACT

A decrease in image quality is suppressed. A solid-state imaging apparatus according to an embodiment includes: a photoelectric conversion unit (PD) including a material having a smaller band gap energy than silicon; and a circuit board joined to the photoelectric conversion unit, the circuit board including: a pixel signal generation circuit that generates a pixel signal having a voltage value corresponding to a charge generated in the photoelectric conversion unit; and a thermometer circuit that detects a temperature of the circuit board.

14 Claims, 21 Drawing Sheets

(51) Int. Cl.
*H04N 25/709* (2023.01)
*H04N 25/79* (2023.01)

(52) U.S. Cl.
CPC ....... *H01L 27/14643* (2013.01); *H04N 25/63* (2023.01); *H04N 25/79* (2023.01); *H04N 25/709* (2023.01)

(56) References Cited

U.S. PATENT DOCUMENTS

| | | |
|---|---|---|
| 2013/0288470 A1 | 10/2013 | Takahashi et al. |
| 2014/0303452 A1* | 10/2014 | Ghaffari ............ H01L 27/14687 601/3 |
| 2014/0327101 A1 | 11/2014 | Mori et al. |
| 2014/0367818 A1 | 12/2014 | Iguchi et al. |
| 2017/0131089 A1* | 5/2017 | Bronstein ................ H04N 5/33 |
| 2018/0182806 A1* | 6/2018 | Jin .................... H01L 27/14685 |
| 2020/0029033 A1 | 1/2020 | Xu et al. |
| 2020/0035739 A1 | 1/2020 | Saito et al. |

FOREIGN PATENT DOCUMENTS

| | | |
|---|---|---|
| JP | 2011-130364 | 6/2011 |
| JP | 2013-232529 | 11/2013 |
| JP | 2014-241376 | 12/2014 |
| JP | 2015-005533 | 1/2015 |
| JP | 2017-092781 | 5/2017 |
| JP | 2018-182020 | 11/2018 |
| WO | WO 2013/084529 | 6/2013 |
| WO | WO 2018/194030 | 10/2018 |

* cited by examiner

SOLID-STATE IMAGING APPARATUS, IMAGING APPARATUS, AND IMAGING SYSTEM

CROSS REFERENCE TO RELATED APPLICATIONS

This application is a national stage application under 35 U.S.C. 371 and claims the benefit of PCT Application No. PCT/JP2020/048291, having an international filing date of 23 Dec. 2020, which designated the United States, which PCT application claimed the benefit of Japanese Patent Application No. 2020-001209, filed 8 Jan. 2020, the entire disclosures of each of which are incorporated herein by reference.

TECHNICAL FIELD

The present disclosure relates to a solid-state imaging apparatus, an imaging apparatus, and an imaging system.

BACKGROUND ART

In recent years, a solid-state image pickup element, such as a complementary metal oxide semiconductor (CMOS) image sensor (CIS: CMOS image sensor) has become widespread, and is utilized in place of a film-type imaging apparatus in various fields. The solid-state image pickup element is not only utilized in place of the film-type imaging apparatus in imaging of normal visible light, but also remarkably used in imaging of invisible light such as ultraviolet rays, infrared rays, X-rays, and gamma rays.

Moreover, among imaging apparatuses having photoelectric conversion films in solid-state image pickup elements, there are imaging apparatuses that handle positive holes as carriers for photoelectric conversion. For example, the photoelectric conversion films using the positive holes as the carriers for photoelectric conversion include quantum (Q) dots, iridium gallium arsenide (InGaAs) sensors, organic compounds, and the like. In particular, a solid-state image pickup element using InGaAs as a photoelectric conversion film has a low dark current and has a narrower band gap energy than silicon, and can capture long-wavelength light such as infrared light, and thus, is expected to be applied to a high-sensitivity infrared camera and the like.

CITATION LIST

Patent Document

Patent Document 1: Japanese Patent Application Laid-Open No. 2011-130364

SUMMARY OF THE INVENTION

Problems to be Solved by the Invention

However, an image sensor using a material having a narrower band cap energy than silicon such as InGaAs for a photoelectric conversion film has a higher sensitivity to temperature fluctuations than an image sensor using silicon for a photoelectric conversion film. Therefore, the generation of the dark current increases as the temperature becomes higher, so that there is a problem that the image quality decreases.

Thus, the present disclosure proposes a solid-state imaging apparatus, an imaging apparatus, and an imaging system capable of suppressing a decrease in image quality.

Solutions to Problems

In order to solve the above problem, a solid-state imaging apparatus according to an aspect of the present disclosure includes: a photoelectric conversion unit including a material having a smaller band gap energy than silicon; and a circuit board joined to the photoelectric conversion unit, the circuit board including: a pixel signal generation circuit that generates a pixel signal having a voltage value corresponding to a charge generated in the photoelectric conversion unit; and a thermometer circuit that detects a temperature of the circuit board.

MODE FOR CARRYING OUT THE INVENTION

Figure 1:
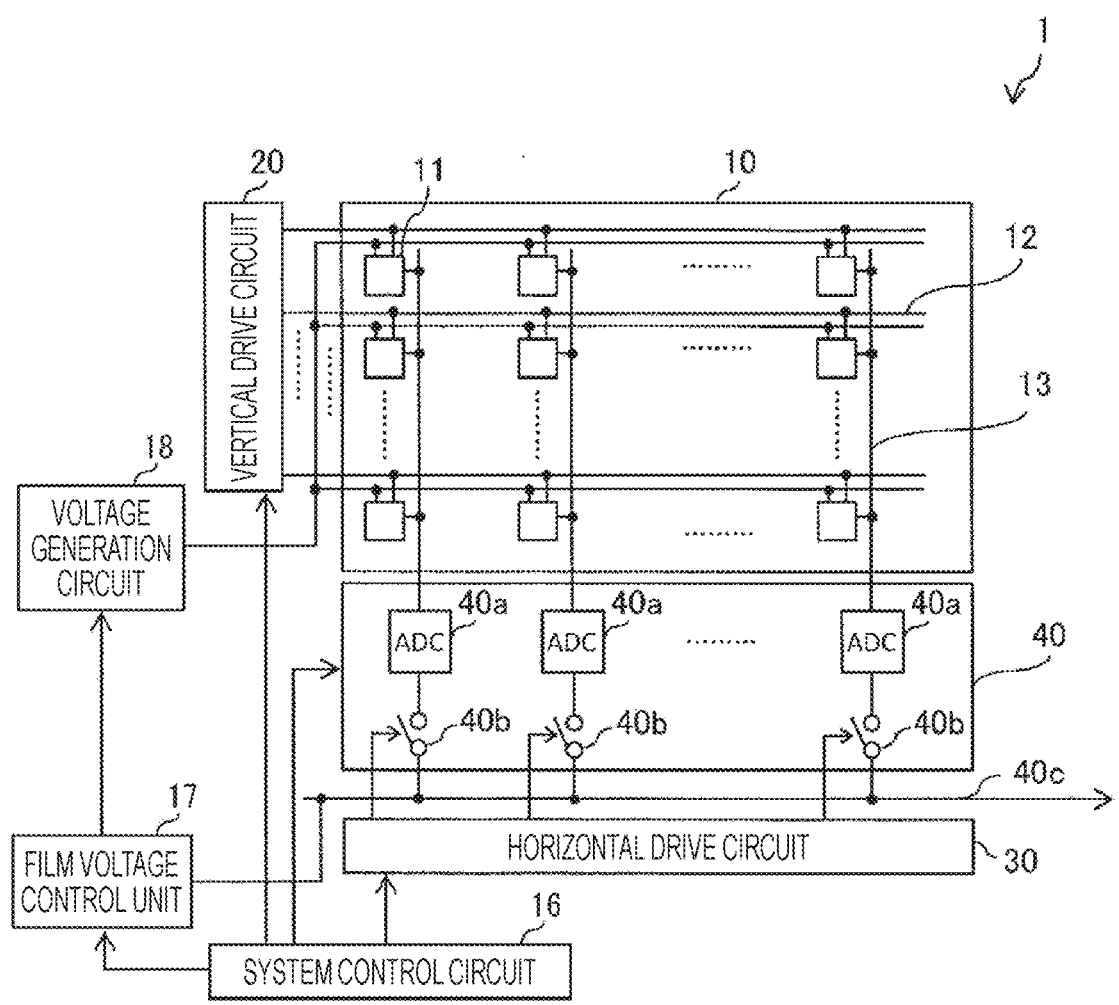
FIG. 1 is a block diagram illustrating a schematic configuration example of a solid-state imaging apparatus according to a first embodiment.

Hereinafter, an embodiment of the present disclosure will be described in detail with reference to the drawings. Note that the same parts will be denoted by the same reference signs in the following embodiment, and the redundant description thereof will be omitted.

Furthermore, the present disclosure will be described according to the following item order.

1. Introduction
2. First Embodiment
   2.1 Configuration Example
   2.2 Cross-Sectional Structure Example of Periphery of Photoelectric Conversion Unit
   2.3 Configuration Example of Solid-State Imaging Apparatus
   2.4 Joining Structure Example
   2.5 Regarding Packaging of Solid-State Imaging Apparatus
   2.6 Regarding Temperature Control Mechanism
   2.7 Regarding Position of Temperature Sensor (Thermometer Circuit)
   2.8 Schematic Configuration Example of Imaging System
      2.8.1 First System Configuration Example
      2.8.2 Second System Configuration Example
   2.9 Arrangement Example of Thermometer Circuit
      2.9.1 First Example
      2.9.2 Second Example
      2.9.3 Third Example
   2.10 Example of Thermometer Circuit
   2.11 Temperature Control Flow
      2.11.1 First Flow Example
      2.11.2 Second Flow Example
3. Application Example 1. Introduction A general solid-state imaging apparatus (hereinafter, also referred to as an image sensor) photo-electrically converts incident light by a photoelectric conversion unit such as a photodiode formed in a silicon substrate, and generates an image on the basis of a charge thus generated.

Furthermore, in recent years, there is also an image sensor in which a compound semiconductor or the like is used for a photoelectric conversion film. Examples thereof include a short-wave infrared (SWIR) sensor in which InGaAs is stacked.

A CMOS image sensor (CIS) uses the photoelectric conversion unit provided on the silicon substrate as a light receiving element and has a sensitivity wavelength physically up to about 1100 nanometers (nm). Since the compound such as InGaAs is used for the photoelectric conversion film, it is possible to produce the image sensor that has sensitivity to infrared light having a wavelength of 1200 nm or more.

This is because InGaAs has a smaller band gap energy than silicon, and the photoelectric conversion can be performed even for light having a long wavelength of 1200 nm or more.

However, a photoelectric conversion material having a smaller band gap energy than silicon has a higher sensitivity than silicon even with respect to temperature fluctuations. Therefore, generation of noise called a dark current increases as the temperature becomes higher.

In order to suppress the generation of the dark current as noise, it is conceivable to provide a mechanism (hereinafter, also referred to as a temperature control mechanism) for cooling or keeping a chip (hereinafter, also referred to as a sensor chip) including a photoelectric conversion film at a constant temperature in a package accommodating the image sensor.

As the temperature control mechanism, for example, a Peltier element or the like can be used. In that case, it is considered a case where a discrete thermistor element for measuring the temperature of the chip is attached to the sensor chip, a temperature control circuit arranged outside the sensor chip controls the Peltier element on the basis of a current or a voltage output from the thermistor element.

For example, the temperature control can be executed by applying a current or a voltage from the temperature control circuit outside the package to the Peltier element in the package through an external terminal provided in the package.

Furthermore, a voltage or a current correlated with the temperature output from the thermistor element in the package is input to the temperature control circuit through the external terminal of the package.

However, the above configuration has the following problems.

First, the temperature control is performed for temperature-induced noise generated in the sensor chip, but the temperature of the sensor chip is not necessarily accurately monitored in the configuration in which the discrete thermistor element is physically mounted in the package. Since a thermal resistance from the sensor chip to the thermistor element varies depending on a mounting situation, an error of a signal output from the thermistor element is also large.

Furthermore, an output of the thermistor element is generally analog, and thus, robustness against external noise is low. It is necessary to wire the output of the thermistor element to the external temperature control circuit, but such wiring is likely to have a capacitance since a control signal line and a power supply wiring are wired in parallel thereto.

Moreover, for example, in a case where the Peltier element is used as the temperature control mechanism, it is necessary to dissipate heat generated by the Peltier element to the outside of the package. Therefore, a wide region in which no terminal is provided is required on a back surface of the package, so that it is difficult to increase the number of terminals provided in the package. Further, a terminal for outputting the output of the thermistor element to the outside of the package and a terminal for inputting a control signal of the Peltier element to the inside of the package are required in addition to a control terminal and a power supply terminal for the image sensor, and the number of terminals of the package is increased accordingly.

Moreover, since the thermistor element is added in the package, a defect of the thermistor element itself or a mounting defect thereof causes deterioration of a product yield as the image sensor.

Therefore, a solid-state imaging apparatus and an imaging system capable of suppressing a decrease in image quality by solving at least one of the above problems are proposed in the following embodiment.

2. First Embodiment

First, a solid-state imaging apparatus and an imaging system according to a first embodiment of the present disclosure will be described in detail with reference to the drawings.

2.1 Configuration Example

Figure 2:
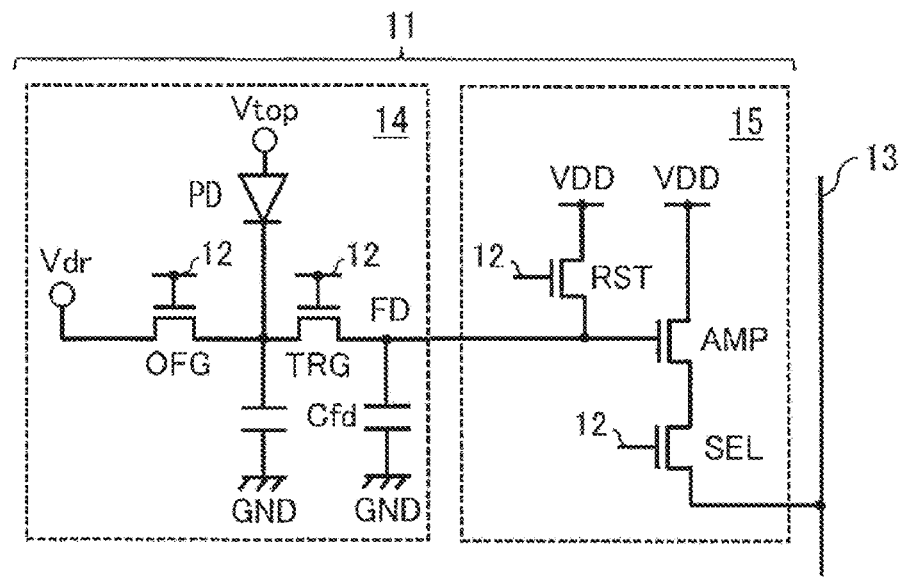
FIG. 2 is a circuit diagram illustrating a schematic configuration example of a sensor pixel according to the first embodiment.
Figure 3:
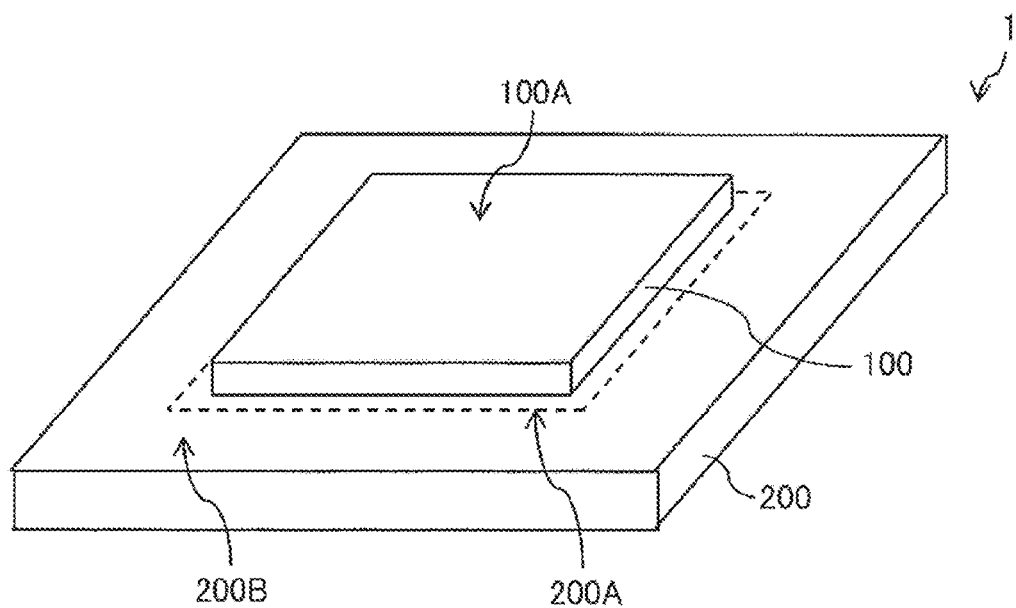
FIG. 3 is a perspective view illustrating a schematic configuration example of the solid-state imaging apparatus according to the first embodiment.

FIG. 1 is a block diagram illustrating a schematic configuration example of the solid-state imaging apparatus according to the first embodiment. FIG. 2 is a circuit diagram illustrating a schematic configuration example of a sensor pixel according to the first embodiment. FIG. 3 is a perspective view illustrating a schematic configuration example of the solid-state imaging apparatus according to the first embodiment.

As illustrated in FIG. 1, a solid-state imaging apparatus 1 is, for example, an infrared image sensor, and has sensitivity to light having a wavelength of 1200 nm or more, for example. The solid-state imaging apparatus 1 includes a pixel array unit 10 in which a plurality of sensor pixels 11 including photoelectric conversion elements is two-dimensionally arranged in a matrix. For example, as illustrated in FIG. 2, the sensor pixel 11 includes a pixel circuit 14 that performs photoelectric conversion, and a readout circuit 15 that outputs a pixel signal based on a charge output from the pixel circuit 14.

The pixel circuit 14 includes, for example, a photodiode PD, a transfer transistor TRG, a floating diffusion FD, and a discharge transistor OFG. The transfer transistor TRG and the discharge transistor OFG are, for example, metal oxide semiconductor (NMOS) transistors. The photodiode PD corresponds to a specific example of a "photoelectric conversion unit" of the present disclosure.

The photodiode PD is the photoelectric conversion unit that absorbs light having a predetermined wavelength (for example, light having a wavelength in an infrared region of a wavelength of 1200 nm or more) and generates a signal charge. As a photoelectric conversion material forming the photodiode PD, for example, a material containing a compound semiconductor such as a group III-V semiconductor can be used.

Examples of the group III-V semiconductor used for the photodiode PD include InGaP, InAlP, InGaAs, InAlAs, a compound semiconductor having a chalcopyrite structure, and the like. The compound semiconductor having the chalcopyrite structure is a material capable of obtaining a high light absorption coefficient and a high sensitivity over a wide wavelength range, and is preferably used as an n-type semiconductor material for photoelectric conversion. The photodiode PD may include amorphous silicon (Si), germanium (Ge), a quantum dot photoelectric conversion film, an organic photoelectric conversion film, and the like in addition to the compound semiconductor described above. In the following description, a case where InGaAs is used for the photodiode PD will be exemplified.

A cathode of the photodiode PD is connected to a source of the transfer transistor TRG, and an anode of the photodiode PD is connected to a power supply line to which a voltage Vtop is applied. A drain of the transfer transistor TRG is connected to the floating diffusion FD, and a gate of the transfer transistor TRG is connected to a pixel drive line 12.

The transfer transistor TRG is connected between the cathode of the photodiode PD and the floating diffusion FD, and the charge held in the photodiode PD is transferred to the floating diffusion FD according to a control signal applied to a gate electrode. The drain of the transfer transistor TRG is electrically connected to the floating diffusion FD, and the gate of the transfer transistor TRG is connected to the pixel drive line 12.

The floating diffusion FD is a floating diffusion region that temporarily holds the charge transferred from the photodiode PD through the transfer transistor TRG. For example, the readout circuit 15 is connected to the floating diffusion FD, and a vertical signal line 13 is connected to the floating diffusion FD through the readout circuit 15. The floating diffusion FD is connected to an input end of the readout circuit 15.

The discharge transistor OFG has a drain connected to the power supply line to which a voltage Vdr is applied, and a source connected to the cathode of the photodiode PD. The discharge transistor OFG initializes (resets) the charge of the photodiode PD according to a control signal applied to the gate electrode.

The readout circuit 15 includes, for example, a reset transistor RST, a selection transistor SEL, and an amplification transistor AMP. A source of the reset transistor RST (the input end of the readout circuit 15) is connected to the floating diffusion FD, and a drain of the reset transistor RST is connected to a power supply line VDD and a drain of the amplification transistor AMP. A gate of the reset transistor RST is connected to the pixel drive line 12. A source of the amplification transistor AMP is connected to a drain of the selection transistor SEL, and a gate of the amplification transistor AMP is connected to the source of the reset transistor RST. A source of the selection transistor SEL (an output end of the readout circuit 15) is connected to the vertical signal line 13, and a gate of the selection transistor SEL is connected to the pixel drive line 12.

The reset transistor RST initializes (resets) a potential of the floating diffusion FD to a predetermined potential. When the reset transistor RST is set to an on-state, the potential of the floating diffusion FD is reset to a potential of the power supply line VDD. The selection transistor SEL controls an output timing of a pixel signal from the readout circuit 15. The amplification transistor AMP generates a signal of a voltage corresponding to a level of the charge held in the floating diffusion FD as the pixel signal. That is, the amplification transistor AMP generates a signal of a voltage corresponding to the amount of received light in the sensor pixel 11 as the pixel signal. The amplification transistor AMP forms a source follower amplifier, and outputs a pixel signal having a voltage corresponding to a level of the charge generated in the photodiode PD. When the selection transistor SEL is set to the on-state, the amplification transistor AMP amplifies a potential of the floating diffusion FD, and outputs a voltage corresponding to the potential to the horizontal selection circuit 40, which will be described later, through the vertical signal line 13.

Note that the selection transistor SEL may be provided between the power supply line VDD and the amplification transistor AMP. In this case, the drain of the reset transistor RST is connected to the power supply line VDD and the drain of the selection transistor SEL. The source of the selection transistor SEL is connected to the drain of the amplification transistor AMP, and the gate of the selection transistor SEL is connected to the pixel drive line 12. The source of the amplification transistor AMP (the output end of the readout circuit 15) is connected to the vertical signal line 13, and the gate of the amplification transistor AMP is connected to the source of the reset transistor RST.

For example, as illustrated in FIG. 3, the solid-state imaging apparatus 1 includes two boards (a light receiving board 100 and a circuit board 200). The solid-state imaging apparatus 1 has a three-dimensional structure (also referred to as a stacked structure) formed by bonding the two boards (the light receiving board 100 and the circuit board 200).

The light receiving board 100 has a structure in which a plurality of photodiodes PD is formed in a matrix on an InGaAs substrate. An upper surface (a surface opposite to the circuit board 200) of the light receiving board 100 is a light receiving surface 100A.

The circuit board 200 has, for example, a structure in which a pixel signal generation circuit region 200A and a peripheral circuit region 200B are provided on one surface side of a silicon (Si) substrate.

In the pixel signal generation circuit region 200A, a plurality of pixel signal generation circuits 45 is formed in a matrix. Each of the pixel signal generation circuits 45 is a circuit excluding the photodiode PD in the sensor pixel 11.

The light receiving board 100 is bonded to the pixel signal generation circuit region 200A in the circuit board 200. This is because the light receiving board 100 does not basically incorporate a circuit element such as a transistor, and mainly functions as the photoelectric conversion film. Furthermore, this is because, if a circuit element other than the pixel circuit 14 (excluding the photodiode PD) is present below the light receiving board 100, there is a possibility that the uniformity of pixels is impaired by the light emitted from the circuit element since light emitted from the circuit element is also photo-electrically converted in a case where a compound semiconductor having sensitivity to light having a longer wavelength than 1200 nm is used for the light receiving board 100.

In the peripheral circuit region 200B, a logic circuit that processes the pixel signal is formed, and for example, a vertical drive circuit 20, a horizontal drive circuit 30, a horizontal selection circuit 40, a system control circuit 16, a film voltage control unit 17, and a voltage generation circuit 18 are arranged. The logic circuit including these outputs the pixel signal (digital value) for each of the sensor pixels 11 to the outside.

Note that the peripheral circuit region 200B not covered with the light receiving board 100 may be covered with an insulating film such as passivation, for example.

In this manner, the solid-state imaging apparatus 1 includes the pixel array unit 10, the vertical drive circuit 20, the horizontal drive circuit 30, the horizontal selection circuit 40, the system control circuit 16, the film voltage control unit 17, and the voltage generation circuit 18.

On the basis of a master clock, the system control circuit 16 generates a clock signal, a control signal, or the like to be a reference of operations of the vertical drive circuit 20, the horizontal drive circuit 30, the horizontal selection circuit 40, the film voltage control unit 17, and the like, and applies the clock signal, the control signal, or the like to the vertical drive circuit 20, the horizontal selection circuit 40, the film voltage control unit 17, and the like.

The vertical drive circuit 20 includes, for example, a shift register and the like, and controls scanning of rows of the plurality of sensor pixels 11 through the plurality of pixel drive lines 12.

The horizontal selection circuit 40 is, for example, a circuit in which analog-to-digital converters (ADCs) 40a and switch elements 40b are provided respectively for pixel columns (or the vertical signal lines 13) of the pixel array unit 10. The ADC 40a performs AD conversion on the pixel signal. The ADC 40a can vary an analog range R, and sets the analog range R based on a range setting value input from the outside. Note that it is assumed that the analog range R is set to Ra in the present embodiment.

The vertical signal line 13 is connected to an input end of the ADC 40a, and the switch element 40b is connected to an output end of the ADC 40a. The horizontal drive circuit 30 includes, for example, a shift register and the like, and sequentially drives the respective switch elements 40b of the horizontal selection circuit 40. Since the respective switch elements 40b are sequentially driven by the horizontal drive circuit 30, the respective pixel signals transmitted through the respective vertical signal lines 13 are sequentially output to horizontal signal lines 40c and input to a DSP circuit or the like.

The film voltage control unit 17 controls a film voltage Vf applied to each of the photodiodes PD on the basis of the pixel signal obtained from the sensor pixel 11. The film voltage control unit 17 outputs a control signal for controlling the film voltage Vf to the voltage generation circuit 18. The voltage generation circuit 18 generates analog voltages (voltages Vtop and Vdr) on the basis of the control signal input from the film voltage control unit 17, and applies the voltages to each of the photodiodes PD through the power supply line. That is, the film voltage control unit 17 and the voltage generation circuit 18 apply the film voltage Vf based on the pixel signal obtained from the sensor pixel 11 to each of the photodiodes PD to control the image quality of image data obtained from the pixel signal.

Figure 4:
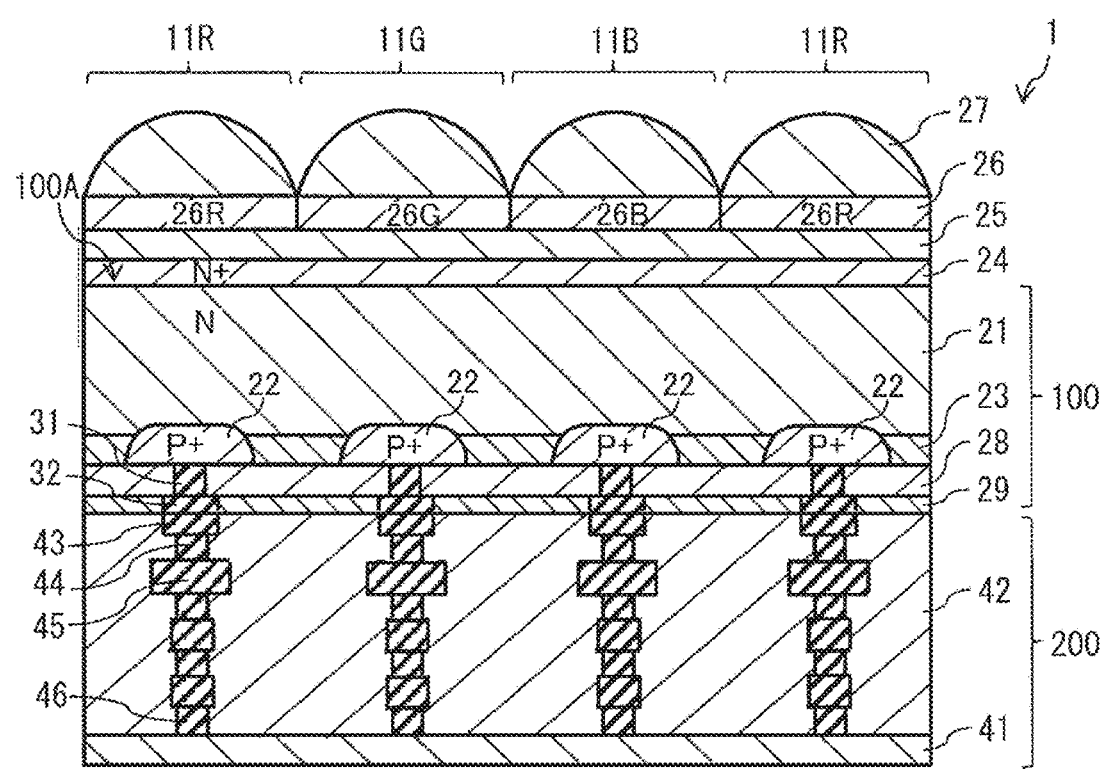
FIG. 4 is a cross-sectional view illustrating a cross-sectional configuration example of the solid-state imaging apparatus according to the first embodiment.

2.2 Cross-Sectional Structure Example of Periphery of Photoelectric Conversion Unit FIG. 4 is a cross-sectional view illustrating a cross-sectional configuration example of a periphery of the photoelectric conversion unit (photodiode PD) in the solid-state imaging apparatus according to the first embodiment. As illustrated in FIG. 4, the light receiving board 100 includes an n-type semiconductor film 21 that is the photoelectric conversion unit (photodiode PD) in the solid-state imaging apparatus 1. The n-type semiconductor film 21 is formed on the entire surface of the pixel array unit 10, and includes the above-described material as a material used for the photodiode PD, for example. Note that other configurations will be described hereinafter assuming that the n-type semiconductor film 21 includes InGaAs.

The light receiving board 100 further includes a p-type semiconductor layer 22 in contact with a surface of the n-type semiconductor film 21 on the circuit board 200 side for each of the sensor pixels 11. Each of the p-type semiconductor layers 22 is formed using a p-type semiconductor having a high concentration, and includes p-type InGaAs, for example. The p-type semiconductor layer 22 functions as an electrode (second electrode) of the photodiode PD. To the p-type semiconductor layer 22, a predetermined voltage Vdr is applied through the discharge transistor OFG in the on-state, or a voltage Vdd of the power supply line VDD is applied through the transfer transistor TRG and the reset transistor RST in the on-state. The light receiving board 100 further includes an n-type semiconductor layer 23 that isolates the p-type semiconductor layers 22 from each other. The n-type semiconductor layer 23 is formed in the same layer as each of the p-type semiconductor layers 22, and includes, for example, n-type InP.

The light receiving board 100 further includes an n-type semiconductor layer 24 in contact with a surface of the n-type semiconductor film 21 on the light receiving surface 100A side. The n-type semiconductor layer 24 is formed using an n-type semiconductor having a higher concentration than the n-type semiconductor film 21, and includes, for example, n-type InGaAs, n-type InP, or n-type InAlAs. The n-type semiconductor layer 24 functions as a barrier layer that prevents a reverse flow of a charge generated in the n-type semiconductor film 21. The light receiving board 100 further includes an antireflection film 25 in contact with a surface of the n-type semiconductor layer 24 on the light receiving surface 100A side. The antireflection film 25 includes, for example, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$), or the like. The n-type semiconductor layer 24 also functions as an upper electrode (first electrode) among electrodes vertically sandwiching the n-type semiconductor film 21. A predetermined voltage Vtop is applied to the upper electrode.

The light receiving board 100 further includes a color filter 26 and an on-chip lens 27 on the antireflection film 25. The color filter 26 includes a plurality of filters 26R selectively transmitting red light, a plurality of filters 26G selectively transmitting green light, and a plurality of filters 26G selectively transmitting blue light. The plurality of filters 26R, 26G, and 26B is provided for the sensor pixels 11, respectively, and is arranged in a Bayer array in a plane parallel to the light receiving surface 100A, for example. Note that the sensor pixel 11 provided with the filter 26R is denoted as 11R in FIG. 4, the sensor pixel 11 provided with the filter 26G is denoted as 11G, and the sensor pixel 11 provided with the filter 26B is denoted as 11B. Note that the color filter 26 may be omitted as necessary.

The light receiving board 100 further includes a passivation layer 28 and an insulating layer 29 below the p-type semiconductor layer 22 and the n-type semiconductor layer 23. The light receiving board 100 further includes connection electrodes 31 that penetrate through the passivation layer 28 and are in contact with the p-type semiconductor layer 22, and bump electrodes 32 that penetrate through the insulating layer 29 and are in contact with the connection electrodes 31. One set of the connection electrode 31 and the bump electrode 32 is provided for each of the sensor pixels 11. The bump electrode 32 is joined to a connection layer 43 (to be described later) of the circuit board 200, and is electrically connected to the connection layer 43. The bump electrode 32 is joined to the connection layer 43 of the circuit board 200, for example, when the light receiving board 100 and the circuit board 200 are bonded to each other.

Note that the passivation layer 28 and the insulating layer 29 may be configured as interlayer insulating layers. At this time, at least one of the passivation layer 28 or the insulating layer 29 may have a multilayer structure. In a case where the passivation layer 28 and the insulating layer 29 are used as the interlayer insulating layers, each of the connection electrode 31 and the bump electrode 32 may be a part of a wiring provided in a layer-viewed insulating layer. In that case, the wiring (bump electrode 32) of the interlayer insulating layer and the wiring (connection layer 43) of an interlayer insulating layer 42 in the circuit board 200 are directly joined to each other, so that the light receiving board 100 (for example, the photodiode PD) and the circuit board 200 (for example, the pixel circuit 14 and the readout circuit 15 other than the photodiode PD) are electrically connected.

The circuit board 200 includes a support substrate 41 and the interlayer insulating layer 42. The support substrate 41 includes, for example, a silicon (Si) substrate. The interlayer insulating layer 42 is provided between the support substrate 41 and an insulating layer 291 (the light receiving board 100). In the interlayer insulating layer 42, for example, a plurality of the connection layers 43, a plurality of readout electrodes 44, a plurality of pixel signal generation circuits 45, and a plurality of wirings 46 are provided in order from a position close to the light receiving board 100. A plurality of sets of the connection layer 43, the readout electrode 44, the pixel signal generation circuit 45, and the wiring 46 is provided for each of the sensor pixels 11. The plurality of interlayer insulating layers 42 in the interlayer insulating layer 42 is provided, for example, in a readout IC (ROIC) for readout of a charge from each of the photodiodes PD. The above-described logic circuit is provided at a location corresponding to the peripheral circuit region 200B in the interlayer insulating layer 42 of the circuit board 200.

2.3 Configuration Example of Solid-State Imaging Apparatus

Figure 5:
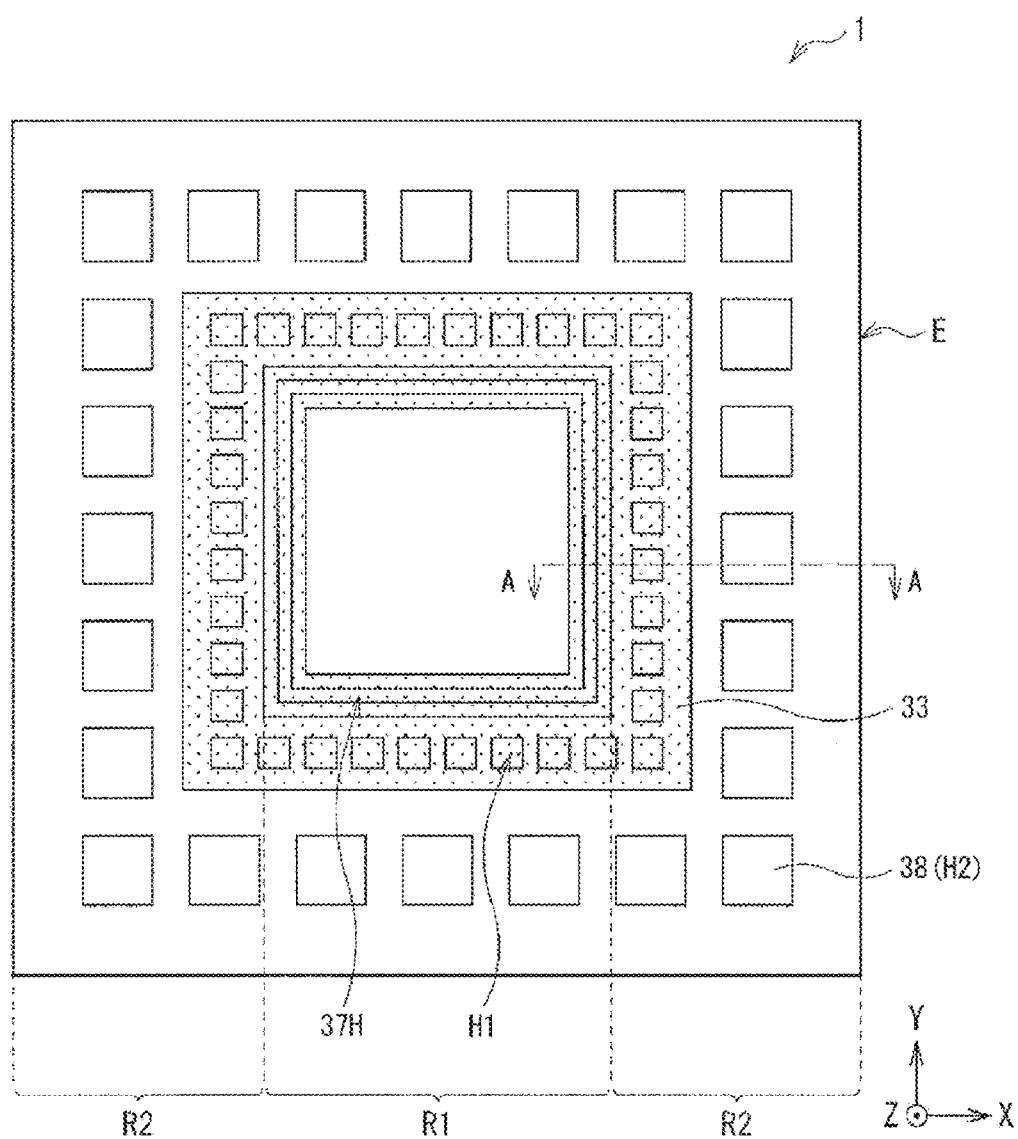
FIG. 5 is a schematic plan view illustrating a schematic configuration of a light receiving element according to the first embodiment.
Figure 6:
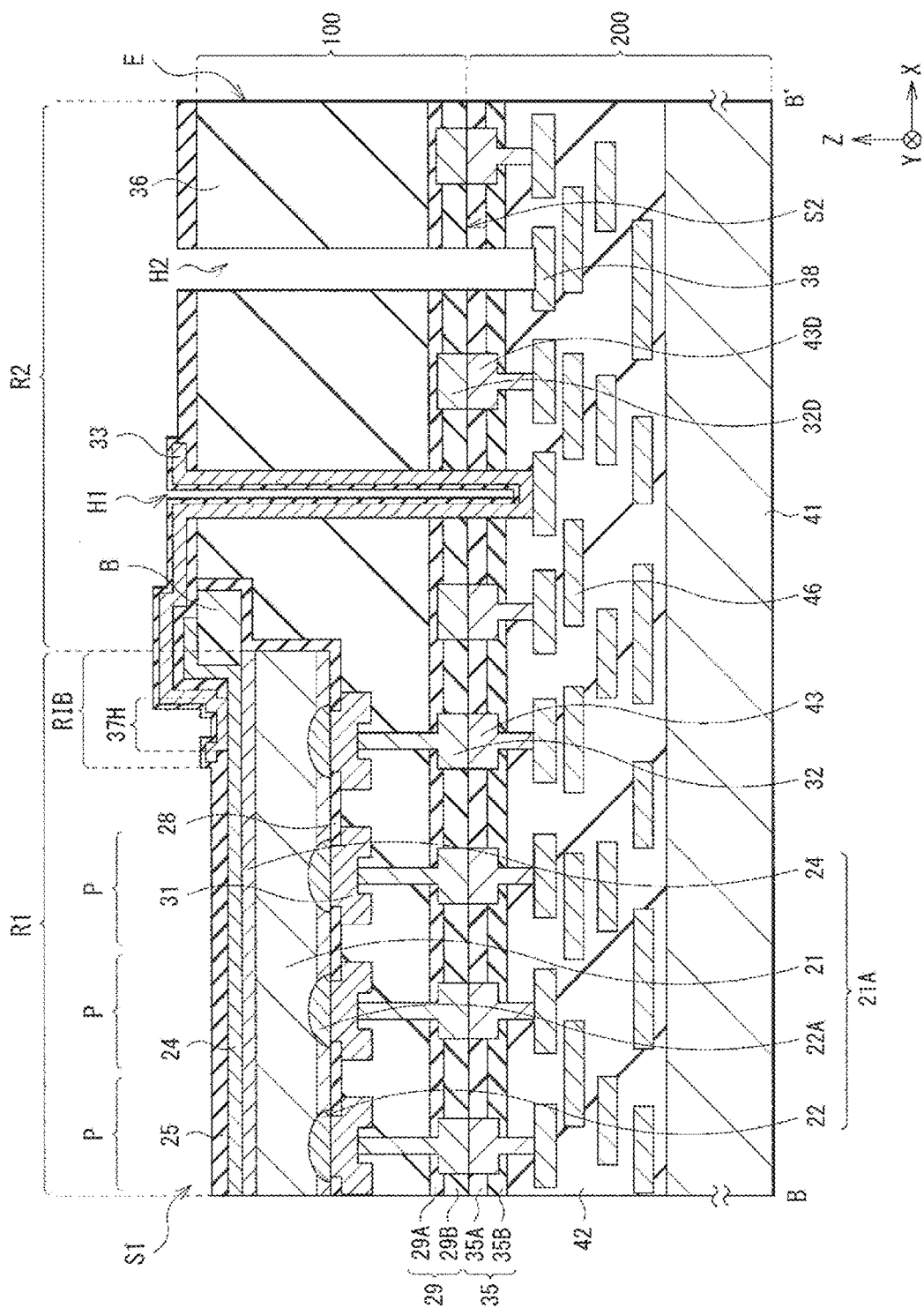
FIG. 6 is a schematic view illustrating a cross-sectional configuration taken along line A-A in FIG. 5.

FIGS. 5 and 6 are views illustrating configuration examples of the solid-state imaging apparatus according to the first embodiment. FIG. 5 illustrates a planar configuration of the solid-state imaging apparatus 1, and FIG. 6 illustrates a cross-sectional configuration taken along line A-A in FIG. 5. The solid-state imaging apparatus 1 is provided with, for example, a plurality of light receiving unit regions P (the sensor pixels 11) arranged two-dimensionally (FIG. 6).

The solid-state imaging apparatus 1 includes an element region R1 in a central portion and a peripheral region R2 provided outside the element region R1 and surrounding the element region R1 (FIG. 5). The solid-state imaging apparatus 1 includes a conductive film 33 provided from the element region R1 to the peripheral region R2. The conductive film 33 has an opening in a region facing a central portion of the element region R1.

The solid-state imaging apparatus 1 has a stacked structure of the light receiving board 100 and the circuit board 200 (FIG. 6). One surface of the light receiving board 100 is a light incident surface (light incident surface S1), and a surface (other surface) opposite to the light incident surface S1 is a joint surface (joint surface S2) with the circuit board 200.

The light receiving board 100 includes the insulating layer 29, the connection electrode 31, a semiconductor layer 21A, the n-type semiconductor layer 24, and the antireflection film 25 in this order from a position close to the circuit board 200. A surface facing the insulating layer 29 and an end surface (side surface) of the semiconductor layer 21A are covered with the passivation layer 28. The circuit board 200 is a so-called readout integrated circuit (ROIC), and includes a wiring layer 35 and the interlayer insulating layer 42, which are in contact with the joint surface S2 of the light receiving board 100, and the support substrate 41 facing the light receiving board 100 with the wiring layer 35 and the interlayer insulating layer 42 interposed therebetween.

The light receiving board 100 includes the semiconductor layer 21A in the element region R1. In other words, a region in which the semiconductor layer 21A is provided is the element region R1 of the solid-state imaging apparatus 1. In the element region R1, a region exposed from the conductive film 33 (a region facing the opening of the conductive film 33) is a light receiving region. In the element region R1, a region covered with the conductive film 33 is an optical black (OPB) region R1B. The OPB region R1B is provided so as to surround the light receiving region. The OPB region R1B is used to obtain a black-level pixel signal. The light receiving board 100 includes a buried layer 36 together with the passivation layer 28 in the peripheral region R2. Holes H1 and H2 penetrating through the light receiving board 100 and reaching the circuit board 200 are provided in the peripheral region R2. In the solid-state imaging apparatus 1, light is incident on the semiconductor layer 21A from the light incident surface S1 of the light receiving board 100 through the antireflection film 25, the n-type semiconductor layer 24, and the n-type semiconductor layer 24. A signal charge photo-electrically converted by the semiconductor layer 21A moves through the connection electrode 31 and the insulating layer 29 and is read out by the circuit board 200. Next, configurations of the respective portions will be described.

The insulating layer 29 is provided over the element region R1 and the peripheral region R2, and has the joint surface S2 with the circuit board 200. In the solid-state imaging apparatus 1, the joint surface S2 of the light receiving board 100 is provided in the element region R1 and the peripheral region R2, and for example, the joint surface S2 of the element region R1 and the joint surface S2 of the peripheral region R2 constitute the same plane. In the solid-state imaging apparatus 1, the buried layer 36 is provided to form the joint surface S2 of the peripheral region R2 as described later.

The insulating layer 29 includes, for example, the bump electrode 32 and a dummy electrode 32D in interlayer insulating films 29A and 29B constituting the insulating layer 29. For example, the interlayer insulating film 29B is arranged on the circuit board 200 side, the interlayer insulating film 29A is arranged on the p-type semiconductor layer 22 side, and these interlayer insulating films 29A and 29B are provided in a stacked manner. The interlayer insulating films 29A and 29B include, for example, an inorganic insulating material. Examples of the inorganic insulating material include silicon nitride (SiN), aluminum oxide ($Al_2O_3$), silicon oxide ($SiO_2$), hafnium oxide ($HfO_2$), and the like. The interlayer insulating films 29A and 29B may include the same inorganic insulating material.

The bump electrode 32 is provided in the element region R1, for example. The bump electrode 32 is configured to electrically connect the connection electrode 31 and the circuit board 200, and is provided in the element region R1 for each of pixels P. The adjacent bump electrodes 32 are electrically isolated by the buried layer 36 and the interlayer insulating films 29A and 29B. The bump electrode 32 includes, for example, a copper (Cu) pad, and is exposed on the joint surface S2. The dummy electrode 32D is provided in the peripheral region R2, for example. The dummy electrode 32D is connected to a dummy connection layer 43D of the wiring layer 35 to be described later. Since the dummy electrode 32D and the dummy connection layer 43D are provided, the strength of the peripheral region R2 can be improved. The dummy electrode 32D is formed in the same processing as the bump electrode 32, for example. The dummy electrode 32D includes, for example, a copper (Cu) pad, and is exposed on the joint surface S2.

The connection electrode 31 provided between the bump electrode 32 and the semiconductor layer 21A is an electrode (anode) to which a voltage for reading out a signal charge (a positive hole or an electron, and hereinafter, a description will be given on an assumption that the signal charge is the positive hole for convenience) generated in the n-type semiconductor film 21 is supplied, and is provided in the element region R1 for each of the pixels P. The connection electrode 31 is provided so as to bury an opening of the passivation layer 28, and is in contact with the semiconductor layer 21A (more specifically, a diffusion region 22A). The connection electrode 31 is, for example, larger than the opening of the passivation layer 28, and a part of the connection electrode 31 is provided in the buried layer 36. That is, an upper surface (surface on the semiconductor layer 21A side) of the connection electrode 31 is in contact with the diffusion region 22A, and a lower surface and a part of a side surface of the connection electrode 31 are in contact with the buried layer 36. The adjacent connection electrodes 31 are electrically isolated by the passivation layer 28 and the buried layer 36.

The connection electrode 31 may include, for example, a simple substance of any of titanium (Ti), tungsten (W), titanium nitride (TiN), platinum (Pt), gold (Au), germanium (Ge), palladium (Pd), zinc (Zn), nickel (Ni), and aluminum (Al) or an alloy containing at least one kind of them. The connection electrode 31 may be a single film including such a constituent material, or may be a stacked film obtained by combining two or more kinds. For example, the connection electrode 31 includes a stacked film of titanium and tungsten. A thickness of the connection electrode 31 is, for example, several tens nm to several hundred nm.

The semiconductor layer 21A includes, for example, the p-type semiconductor layer 22, the n-type semiconductor film 21, and the n-type semiconductor layer 24 from a position close to the insulating layer 29. The p-type semiconductor layer 22, the n-type semiconductor film 21, and the n-type semiconductor layer 24 have the same planar shape, and each of end surfaces thereof is arranged at the same position in a plan view.

The p-type semiconductor layer 22 is provided in common for all the pixels P, for example, and is arranged between the passivation layer 28 and the n-type semiconductor film 21. The p-type semiconductor layer 22 is configured to electrically isolate the adjacent pixels P, and the p-type semiconductor layer 22 is provided with, for example, a plurality of the diffusion regions 22A. When a compound semiconductor material having a band gap larger than a band gap of a compound semiconductor material forming the n-type semiconductor film 21 is used for the p-type semiconductor layer 22, a dark current can be suppressed. For the p-type semiconductor layer 22, for example, n-type indium phosphide (InP) can be used.

The diffusion regions 22A provided in the p-type semiconductor layer 22 are arranged apart from each other. The diffusion region 22A is arranged for each of the pixels P, and the connection electrode 31 is connected to each of the diffusion regions 22A. The diffusion region 22A is also provided in the OPB region R1B. The diffusion region 22A is configured to read out the signal charge generated in the n-type semiconductor film 21 for each of the pixels P, and contains, for example, a p-type impurity. Examples of the p-type impurity include zinc (Zn) and the like. In this manner, a pn junction interface is formed between the diffusion region 22A and the p-type semiconductor layer 22 other than the diffusion region 22A, and the adjacent pixels P are electrically isolated. The diffusion region 22A is provided, for example, in a thickness direction of the p-type semiconductor layer 22, and is also provided in a part of the n-type semiconductor film 21 in the thickness direction.

The n-type semiconductor film 21 between the connection electrode 31 and the n-type semiconductor layer 24, more specifically, between the p-type semiconductor layer 22 and the n-type semiconductor layer 24 is provided in common for all the pixels P, for example. The n-type semiconductor film 21 absorbs light of a predetermined wavelength and generates the signal charge, and includes, for example, a compound semiconductor material such as an i-type group III-V semiconductor. Examples of the compound semiconductor material forming the n-type semiconductor film 21 include indium gallium arsenide (InGaAs), indium arsenide antimony (InAsSb), indium arsenide (InAs), indium antimony (InSb), and mercury cadmium telluride (HgCdTe). The n-type semiconductor film 21 may include germanium (Ge). In the n-type semiconductor film 21, for example, photoelectric conversion of light having a wavelength from a visible region to a short infrared region is performed.

The n-type semiconductor layer 24 is provided in common for all the pixels P, for example. The n-type semiconductor layer 24 is provided between and in contact with the n-type semiconductor film 21 and the n-type semiconductor layer 24. The n-type semiconductor layer 24 is a region to which a charge discharged from the n-type semiconductor layer 24 moves, and includes, for example, a compound semiconductor containing an n-type impurity. For the n-type semiconductor layer 24, for example, n-type indium phosphide (InP) can be used.

The n-type semiconductor layer 24 is provided on the n-type semiconductor layer 24 (light incident side) so as to be in contact with the n-type semiconductor layer 24, for example, as an electrode common to the respective pixels P. The n-type semiconductor layer 24 is one (cathode) for discharging a charge that is not used as the signal charge out of the charge generated in the n-type semiconductor film 21. For example, in a case where a positive hole is read out from the connection electrode 31 as the signal charge, for example, an electron can be discharged through the n-type semiconductor layer 24. The n-type semiconductor layer 24 includes, for example, a conductive film capable of transmitting incident light such as an infrared ray. For the n-type semiconductor layer 24, for example, indium tin oxide (ITO), ITiO ($In_2O_3$—$TiO_2$), or the like can be used. For example, the n-type semiconductor layer 24 may be provided in a lattice shape so as to partition the adjacent pixels P. For the n-type semiconductor layer 24, a conductive material having a low light-transmitting property can be used.

The antireflection film 25 covers the n-type semiconductor layer 24 from the light incident surface S1 side. The antireflection film 25 may have an antireflection function. For the antireflection film 25, for example, silicon nitride (SiN), aluminum oxide ($Al_2O_3$), silicon oxide ($SiO_2$), tantalum oxide ($Ta_2O_3$), or the like can be used. The antireflection film 25 has an opening 37H in the OPB region R1B. The opening 37H is provided, for example, in a frame shape surrounding the light receiving region (FIG. 5). The opening 37H may be, for example, a quadrangular or circular hole in a plan view. The conductive film 33 is electrically connected to the n-type semiconductor layer 24 through the opening 37H of the antireflection film 25.

The passivation layer 28 is provided between the p-type semiconductor layer 22 and the buried layer 36, covers the end surface of the p-type semiconductor layer 22, the end surface of the n-type semiconductor film 21, the end surface of the n-type semiconductor layer 24, and the end surface of the n-type semiconductor layer 24, and is in contact with the antireflection film 25 in the peripheral region R2. The passivation layer 28 contains, for example, oxide such as silicon oxide (SiOX) or aluminum oxide ($Al_2O_3$), or the like. The passivation layer 28 may have a stacked structure including a plurality of films. The passivation layer 28 may include a silicon (Si)-based insulating material such as silicon oxynitride (SiON), carbon-containing silicon oxide (SiOC), silicon nitride (SiN), or silicon carbide (SiC). A thickness of the passivation layer 28 is, for example, several tens nm to several hundred nm.

The conductive film 33 is provided from the OPB region R1B to the hole H1 in the peripheral region R2. The conductive film 33 is in contact with the n-type semiconductor layer 24 at the opening 37H of the antireflection film 25 provided in the OPB region R1B, and is in contact with the wiring 46 of the circuit board 200 through the hole H1. Therefore, a voltage is supplied from the circuit board 200 to the n-type semiconductor layer 24 through the conductive film 33. The conductive film 33 functions as a voltage supply path to such an n-type semiconductor layer 24, has a function as a light shielding film, and forms the OPB region R1B. The conductive film 33 includes, for example, a metal material containing tungsten (W), aluminum (Al), titanium (Ti), molybdenum (Mo), tantalum (Ta), or copper (Cu). A passivation film may be provided on the conductive film 33.

An adhesive layer B may be provided between an end portion of the n-type semiconductor layer 24 and the n-type semiconductor layer 24. As described later, the adhesive layer B is used at the time of forming the solid-state imaging apparatus 1, and plays a role of joining the semiconductor layer 21A to a temporary substrate (not illustrated). The adhesive layer B includes, for example, tetraethoxysilane (TEOS), silicon oxide ($SiO_2$), or the like. The adhesive layer B is provided to be wider than the end surface of the p-type semiconductor layer 22, for example, and is covered by the buried layer 36 together with the semiconductor layer 21A. The passivation layer 28 is provided between the adhesive layer B and the buried layer 36.

Note that the adhesive layer B may be provided over a wide region of the peripheral region R2, and may extend from the vicinity of an edge of the semiconductor layer 21A (element region R1) to a gap between the hole H1 and the hole H2, for example. Alternatively, the adhesive layer B may extend from the vicinity of the edge of the semiconductor layer 21A (element region R1) to a chip end (chip end E).

The buried layer 36 is configured to fill a step between the temporary substrate and the semiconductor layer 21A in manufacturing processing of the solid-state imaging apparatus 1. Although details will be described later, a defect in the manufacturing processing is prevented from occurring since the buried layer 36 is formed in the present embodiment, the defect being caused by the step between the semiconductor layer 21A and the temporary substrate.

The buried layer 36 in the peripheral region R2 is provided between the insulating layer 29 and the passivation layer 28 and between the insulating layer 29 and the antireflection film 25, and has a thickness equal to or larger than a thickness of the semiconductor layer 21A, for example.

Here, the buried layer 36 is provided to surround the semiconductor layer 21A, and thus, the region (peripheral region R2) around the semiconductor layer 21A is formed. Therefore, the joint surface S2 with the circuit board 200 can be provided in the peripheral region R2. The thickness of the buried layer 36 may be reduced as long as the joint surface S2 is formed in the peripheral region R2, but it is preferable that the buried layer 36 cover the semiconductor layer 21A in the thickness direction and that the entire end surface of the semiconductor layer 21A be covered with the buried layer 36. Since the buried layer 36 covers the entire end surface of the semiconductor layer 21A through the passivation layer 28, it is possible to effectively prevent moisture from entering the semiconductor layer 21A. The buried layer 36 in the element region R1 is provided between the semiconductor layer 21A and the insulating layer 29 so as to cover the connection electrode 31.

A surface of the buried layer 36 on the joint surface S2 side is planarized, and the insulating layer 29 is provided on the planarized surface of the buried layer 36 in the peripheral region R2. For the buried layer 36, for example, an inorganic insulating material such as silicon oxide (SiOX), silicon nitride (SiN), silicon oxynitride (SiON), carbon-containing silicon oxide (SiOC), or silicon carbide (SiC) can be used.

As described later, the insulating layer 29 including the interlayer insulating films 29A and 29B and the bump electrode 32 is formed above the buried layer 36 after the buried layer 36 is formed in the manufacturing processing of the solid-state imaging apparatus 1. The circuit board 200 including the wiring layer 35 is bonded to the light receiving board 100 including the insulating layer 29 to form the solid-state imaging apparatus 1. At this time, the bump electrode 32 of the insulating layer 29 and the connection layer 43 of the wiring layer 35 are connected. Each of the bump electrode 32 and the connection layer 43 includes, for example, a Cu pad, and the bump electrode 32 and the connection layer 43 are connected by directly joining these Cu pads. When the bump electrode 32 is formed using a chemical mechanical polishing (CMP) method, the buried layer 36 arranged below a copper film to be polished is required to have hardness that can withstand stress during the polishing. Furthermore, it is necessary to form the light receiving board 100 and the circuit board 200 to be extremely flat in order to directly join the Cu pads of the bump electrode 32 and the connection layer 43 to each other. For this reason, the buried layer 36 arranged below the copper film preferably has hardness that can withstand stress during the polishing. Specifically, a constituent material of the buried layer 36 is preferably a material having a higher hardness than a sealant or an organic material arranged around a die in a general semiconductor package. Examples of the material having such a high hardness include an inorganic insulating material. The buried layer 36 can be formed by depositing the inorganic insulating material by, for example, a chemical vapor deposition (CVD) method, a sputtering method, or a coating method.

The buried layer 36 is provided with the holes H1 and H2 penetrating through the buried layer 36. The holes H1 and H2 penetrate through the insulating layer 29 as well as the buried layer 36 and reach the circuit board 200. The holes H1 and H2 have, for example, a quadrangular planar shape, and each of the plurality of holes H1 and H2 is provided to surround the element region R1 (FIG. 5). The hole H1 is provided at a position closer to the element region R1 than the hole H2, and a side wall and a bottom surface of the hole H1 are covered with the conductive film 33. The hole H1 is configured to connect the n-type semiconductor layer 24 (conductive film 33) and the wiring (wiring 46 to be described later) of the circuit board 200, and penetrates through the antireflection film 25, the buried layer 36, and the insulating layer 29.

The hole H2 is provided, for example, at a position closer to the chip end E than the hole H1. The hole H2 penetrates through the antireflection film 25, the buried layer 36, and the insulating layer 29 and reaches a pad electrode (a pad electrode 38 to be described later) of the circuit board 200. The solid-state imaging apparatus 1 is electrically connected to the outside through the hole H2. The holes H1 and H2 do not necessarily reach the circuit board 200. For example, the holes H1 and H2 may reach a wiring of the insulating layer 29, and the wiring may be connected to the wiring 46 of the circuit board 200 and the pad electrode 38. The holes H1 and H2 may penetrate through the adhesive layer B.

A positive hole and an electron generated in the n-type semiconductor film 21 are read out from the connection electrode 31 and the n-type semiconductor layer 24. In order to perform this read-out operation at a high speed, it is preferable to set a distance between the connection electrode 31 and the n-type semiconductor layer 24 to a distance that is sufficient for photoelectric conversion and is not excessively isolated. That is, it is preferable to reduce a thickness of the light receiving board 100. For example, the distance between the connection electrode 31 and the n-type semiconductor layer 24 or the thickness of the light receiving board 100 is 10 μm or less, further 7 μm or less, and further 5 μm or less.

The support substrate 41 of the circuit board 200 faces the light receiving board 100 with the wiring layer 35 and the interlayer insulating layer 42 interposed therebetween. The support substrate 41 includes, for example, silicon (Si). A plurality of transistors is provided in the vicinity of a surface (surface on the wiring layer 35 side) of the support substrate 41. For example, the plurality of transistors is used to form a readout circuit for each of the pixels P. The wiring layer 35 includes, for example, an interlayer insulating film 35A and an interlayer insulating film 35B in this order from the light receiving board 100 side, and these interlayer insulating films 35A and 35B are provided in a stacked manner. For example, the connection layer 43 and the dummy connection layer 43D are provided in the interlayer insulating film 35A. The interlayer insulating layer 42 is provided to face the light receiving board 100 with the wiring layer 35 interposed therebetween. For example, the pad electrode 38 and the plurality of wirings 46 are provided in the interlayer insulating layer 42. The interlayer insulating films 35A and 35B include, for example, an inorganic insulating material. Examples of the inorganic insulating material include silicon nitride (SiN), aluminum oxide ($Al_2O_3$), silicon oxide ($SiO_2$), hafnium oxide ($HfO_2$), and the like.

The connection layer 43 is configured to electrically connect the connection electrode 31 and the wiring 46, and is provided in the element region R1 for each of the pixels P. The connection layer 43 is in contact with the bump electrode 32 at the joint surface S2 of the light receiving board 100. The adjacent connection layers 43 are electrically isolated by the interlayer insulating film 35A.

The dummy connection layer 43D provided in the peripheral region R2 is in contact with the dummy electrode 32D at the joint surface S2 of the light receiving board 100. The dummy connection layer 43D is formed in the same processing as the connection layer 43, for example. Each of the connection layer 43 and the dummy connection layer 43D includes, for example, a copper (Cu) pad, and are exposed on a surface of the circuit board 200 facing the light receiving board 100. That is, for example, a Cu—Cu junction is performed between the bump electrode 32 and the connection layer 43 and between the dummy electrode 32D and the dummy connection layer 43D. Therefore, it is possible to miniaturize the pixel P although details will be described later.

The wiring 46 connected to the bump electrode 32 is connected to the transistor provided in the vicinity of the surface of the support substrate 41, and the connection electrode 31 and the readout circuit are connected for each of the pixels P. The wiring 46 connected to the conductive film 33 through the hole H1 is connected to, for example, a predetermined potential. In this manner, one (for example, the positive hole) out of the charge generated in the n-type semiconductor film 21 is read out from the connection electrode 31 to the readout circuit through the bump electrode 32 and the connection layer 43, and the other (for example, the electron) out of the charge generated in the n-type semiconductor film 21 is discharged from the n-type semiconductor layer 24 to a predetermined potential through the conductive film 33.

The pad electrode 38 provided in the peripheral region R2 is configured for an electrical connection with the outside. The hole H2 that penetrates through the light receiving board 100 and reaches the pad electrode 38 is provided in the vicinity of the chip end E of the solid-state imaging apparatus 1, and the electrical connection with the outside is achieved through the hole H2. The connection is achieved by, for example, a method such as wire bond or bump. For example, a predetermined potential may be supplied from an external terminal arranged in the hole H2 to the n-type semiconductor layer 24 through the wiring 46 and the conductive film 33 of the hole H2. A signal voltage, read out from the connection electrode 31 as a result of the photoelectric conversion in the n-type semiconductor film 21, may be read out to the readout circuit of the support substrate 41 through the bump electrode 32 and the connection layer 43, and output to the external terminal arranged in the hole H2 through the readout circuit. The signal voltage may be output to the external terminal through, for example, other circuits included in the circuit board 200 together with the readout circuit. Examples of the other circuits include a signal processing circuit, an output circuit, and the like.

A thickness of the circuit board 200 is preferably larger than the thickness of the light receiving board 100. For example, the thickness of the circuit board 200 is preferably twice or more, further five times or more, and further ten times or more, larger than the thickness of the light receiving board 100. Alternatively, the thickness of the circuit board 200 is, for example, 100 μm or more, 150 μm or more, or 200 μm or more. The circuit board 200 having such a large thickness secures the mechanical strength of the solid-state imaging apparatus 1. Note that the circuit board 200 may include only one layer of the support substrate 41 forming the circuit, or may further include a substrate such as a support substrate in addition to the support substrate 41 forming the circuit.

2.4 Joining Structure Example

Figure 7:
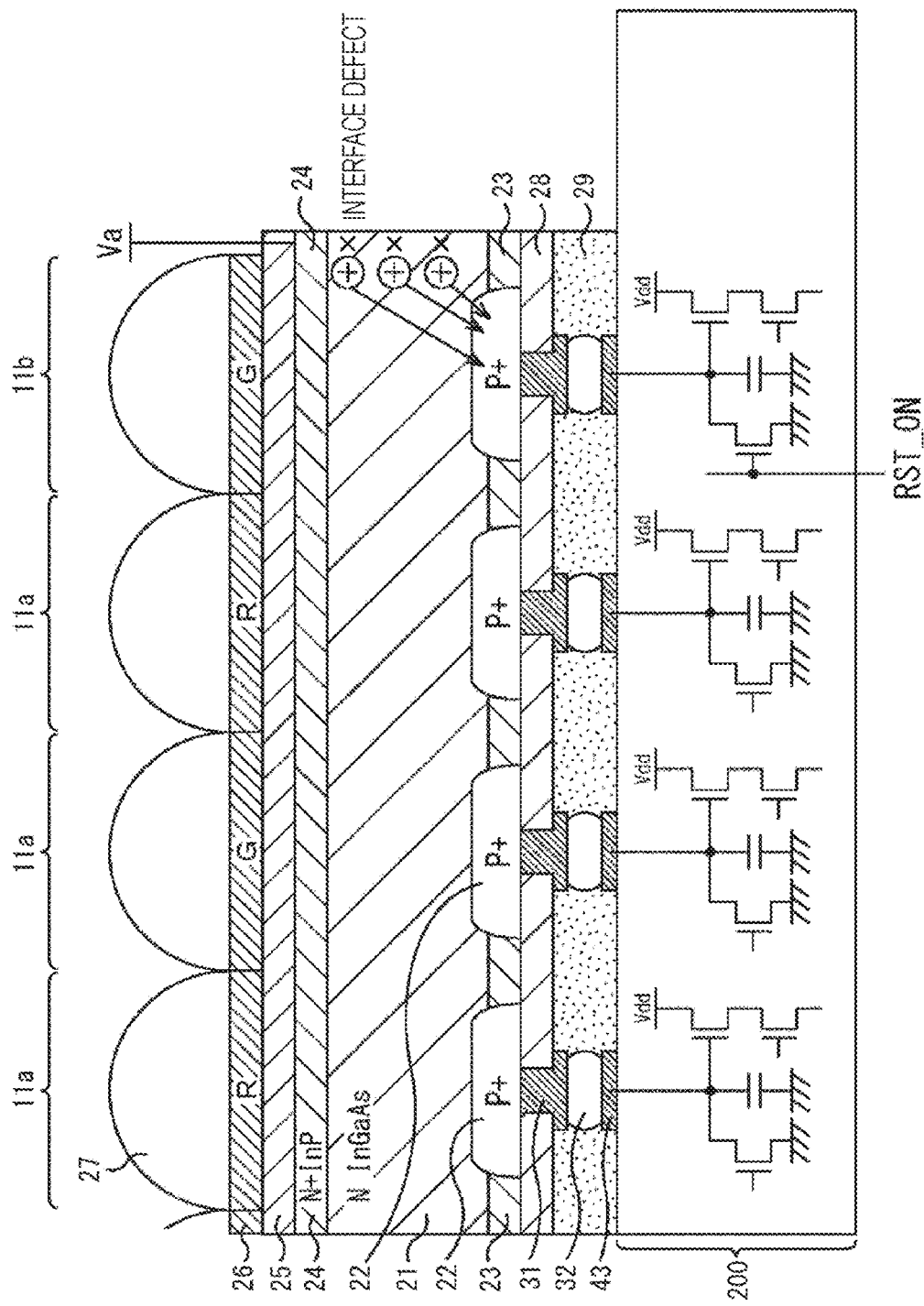
FIG. 7 is a cross-sectional view illustrating a pixel structure of the first embodiment.

Next, a joint structure example of the solid-state imaging apparatus 1 will be described. FIG. 7 is a cross-sectional view illustrating the joint structure example according to the first embodiment. Although the sensor pixels 11 in the pixel array unit 10 are divided into a normal pixel 11a or a charge emitting pixel 11b depending on a difference in control of the reset transistor RST in FIG. 7, both the normal pixel 11a and the charge emitting pixel 11b have the same pixel structure, and thus, will be simply described as the sensor pixel 11. Note that the charge emitting pixel 11b is arranged on the outermost side of the pixel array unit 10.

The pixel signal generation circuit 45 of the transfer transistor TRG, the discharge transistor OFG, the floating diffusion FD, the reset transistor RST, the amplification transistor AMP, and the selection transistor SEL of each of the sensor pixels 11 is formed, for example, per pixel on the circuit board 200 including a single crystal material such as single crystal silicon (Si). Note that reference signs of the transfer transistor TRG, the discharge transistor OFG, the floating diffusion FD, the reset transistor RST, the amplification transistor AMP, and the selection transistor SEL formed on the circuit board 200 are omitted in FIG. 7.

On the upper side, which is the light incident side, of the circuit board 200, the n-type semiconductor film 21 to serve as the photodiode PD is formed on the entire surface of the pixel array unit 10. As the n-type semiconductor film 21, InGaP, InAlP, InGaAs, InAlAs, or a compound semiconductor having a chalcopyrite structure is used. The compound semiconductor having the chalcopyrite structure is a material capable of obtaining a high light absorption coefficient and a high sensitivity over a wide wavelength range, and is preferably used as the n-type semiconductor film 21 for photoelectric conversion. Such a compound semiconductor having the chalcopyrite structure includes elements around group IV elements such as Cu, Al, Ga, In, S, or Se, and examples thereof include a CuGaInS-based mixed crystal, a CuAlGaInS-based mixed crystal, and a CuAlGaInSSe-based mixed crystal.

Furthermore, as a material of the n-type semiconductor film 21, amorphous silicon (Si), germanium (Ge), a quantum dot photoelectric conversion film, an organic photoelectric conversion film, or the like can also be used in addition to the compound semiconductor described above.

In the present embodiment, it is assumed that a compound semiconductor of InGaAs is used as the n-type semiconductor film 21.

On the lower side, which is the circuit board 200 side, of the n-type semiconductor film 21, the high-concentration p-type semiconductor layer 22 constituting the pixel electrode is formed per pixel. Then, the n-type semiconductor layer 23 as a pixel isolation region that isolates each of the sensor pixels 11 includes, for example, a compound semiconductor, such as InP, between the high-concentration p-type semiconductor layers 22 formed per pixel. The n-type semiconductor layer 23 has not only the function as the pixel isolation region but also a function of preventing the dark current.

On the other hand, the n-type semiconductor layer 24 having a higher concentration than the n-type semiconductor film 21 is also formed on the upper side, which is the light incident side, of the n-type semiconductor film 21 using the compound semiconductor such as InP used as the pixel isolation region. This high-concentration n-type semiconductor layer 24 functions as the barrier layer that prevents the reverse flow of the charge generated in the n-type semiconductor film 21. As a material of the high-concentration n-type semiconductor layer 24, for example, a compound semiconductor such as InGaAs, InP, or InAlAs can be used.

The antireflection film 25 is formed on the high-concentration n-type semiconductor layer 24 serving as the barrier layer. As a material of the antireflection film 25, for example, silicon nitride (SiN), hafnium oxide ($HfO_2$), aluminum oxide (Al$_2$O$_3$), zirconium oxide (ZrO$_2$), tantalum oxide (Ta$_2$Ta$_5$), titanium oxide (TiO$_2$), or the like can be used.

Either the high-concentration n-type semiconductor layer 24 or the antireflection film 25 functions as the upper electrode on the upper side among the electrodes vertically sandwiching the n-type semiconductor film 21, and a predetermined voltage Va is applied to the high-concentration n-type semiconductor layer 24 or the antireflection film 25 serving as the upper electrode.

The color filter 26 and the on-chip lens 27 are further formed on the antireflection film 25. The color filter 26 is a filter that transmits light (wavelength light) of any of red (R), green (G), and blue (B), and is arranged in a so-called Bayer array in the pixel array unit 10, for example.

The passivation layer 28 and the insulating layer 29 are formed below the high-concentration p-type semiconductor layer 22 constituting the pixel electrode and the n-type semiconductor layer 23 serving as the pixel isolation region. Then, the connection electrode 31, the connection layer 43, and the bump electrode 32 are formed so as to penetrate the passivation layer 28 and the insulating layer 29. The connection electrode 31, the connection layer 43, and the bump electrode 32 electrically connect the high-concentration p-type semiconductor layer 22 constituting the pixel electrode and the floating diffusion FD that accumulates charges.

The normal pixel 11a and the charge emitting pixel 11b are configured as described above, and have the same pixel structure.

However, a method of controlling the reset transistor RST differs between the normal pixel 11a and the charge emitting pixel 11b.

In the normal pixel 11a, the reset transistor RST is turned on and off on the basis of a reset signal RST in accordance with a charge generation period (light receiving period) by the photodiode PD, a reset period of a potential of the floating diffusion FD before the start of light reception, and the like. However, in the charge emitting pixel 11b, the reset transistor RST is constantly controlled to be turned on. Therefore, the charge generated by the photodiode PD is discharged to the ground, and a constant voltage Va is constantly applied to the charge emitting pixel 11b.

2.5 Regarding Packaging of Solid-State Imaging Apparatus

Figure 8:
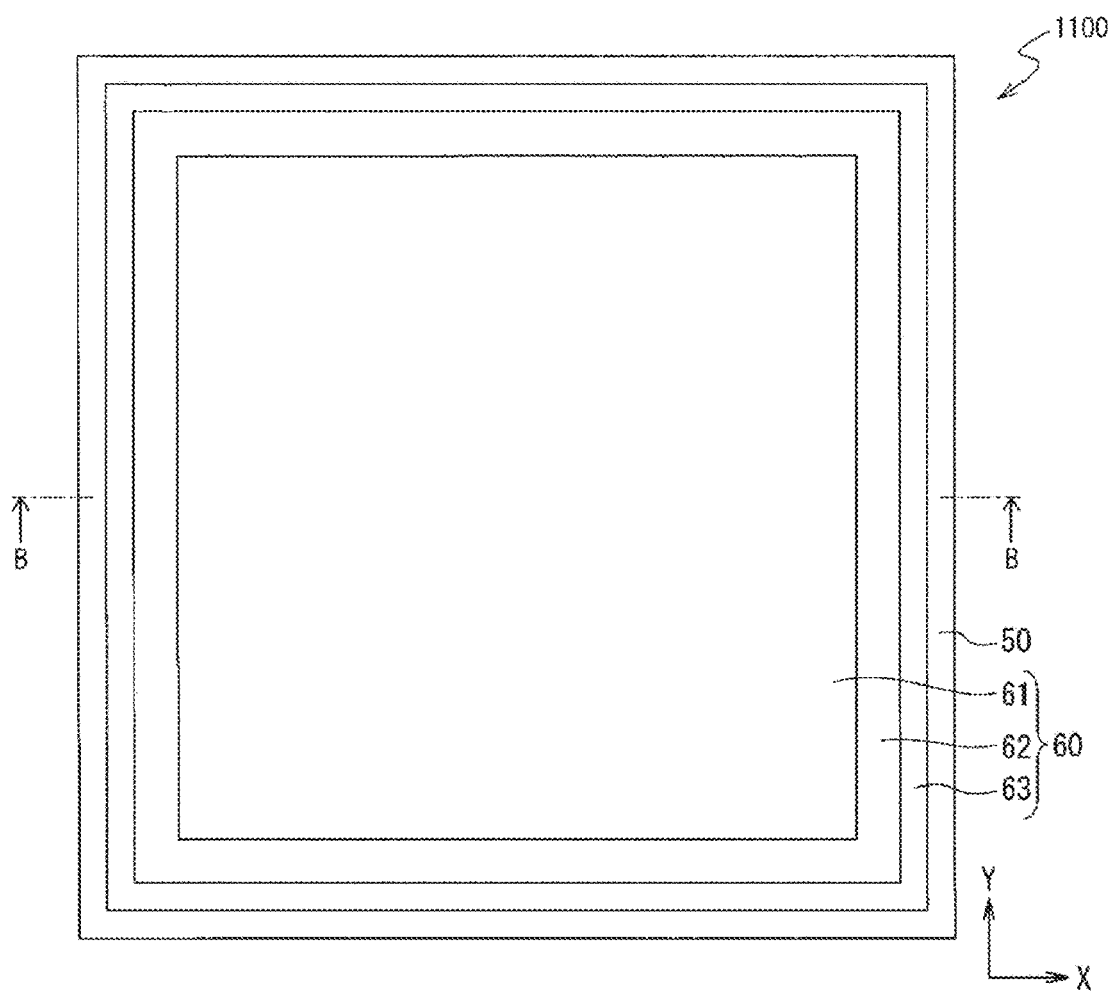
FIG. 8 is a plan view illustrating a configuration example of a sensor package according to the first embodiment.
Figure 9:
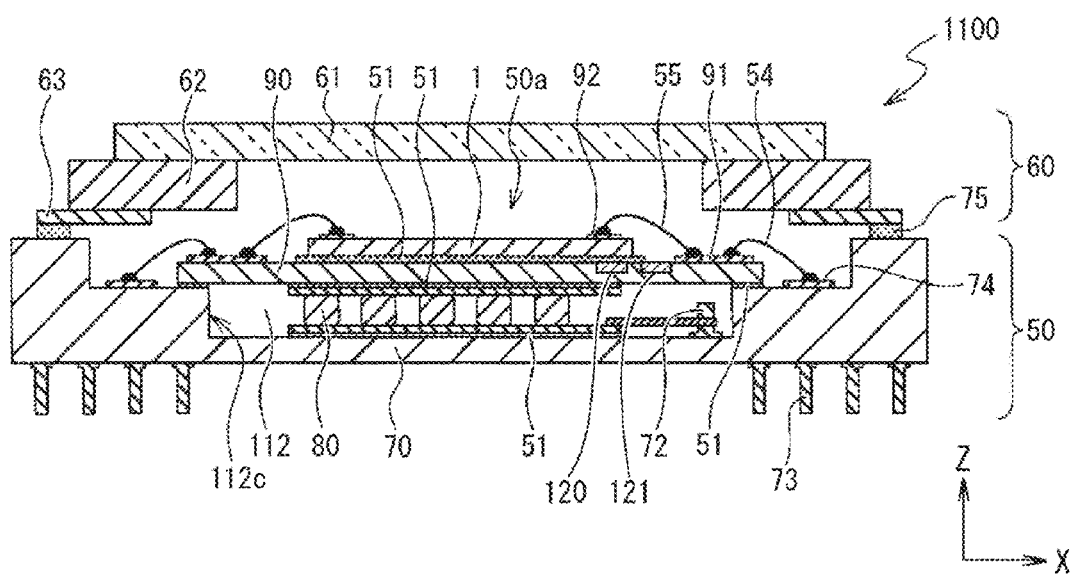
FIG. 9 is a cross-sectional view illustrating a configuration example of the sensor package according to the first embodiment.

Next, packaging of the above-described solid-state imaging apparatus 1 will be described. FIG. 8 is a plan view illustrating a configuration example of a sensor package (also referred to as an imaging apparatus) according to the first embodiment. FIG. 9 is a cross-sectional view illustrating a configuration example of the sensor package according to the first embodiment. Note that FIG. 9 illustrates a cross section of FIG. 8 taken along an X-Z plane passing through line B-B.

As illustrated in FIGS. 8 and 9, a sensor package 1100 includes a package 50 and a lid 60 with sealing glass (an example of a lid) attached to an upper surface 50a side of the package 50. The package 50 includes a package substrate 70, a Peltier element 80, a ceramic interposer substrate 90 (also referred to as a support substrate), and the solid-state imaging apparatus 1. First, a configuration of the package 50 will be described.

Figure 10:
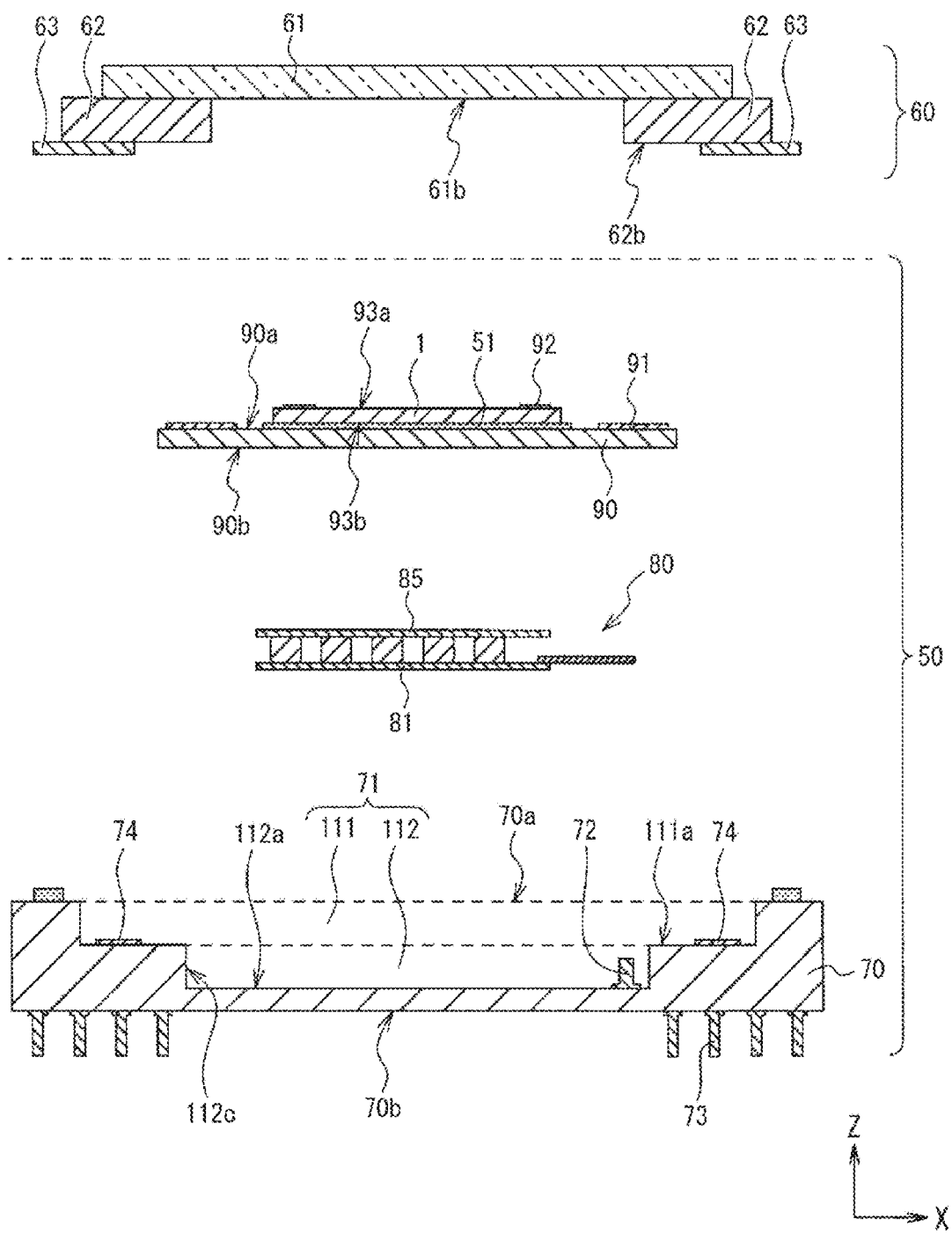
FIG. 10 is an exploded cross-sectional view illustrating a configuration example of the sensor package according to the first embodiment.

FIG. 10 is an exploded cross-sectional view illustrating the configuration example of the sensor package according to the first embodiment. The package substrate 70 is a multilayer substrate including ceramic such as alumina (aluminum oxide), and is, for example, a pin grid array (PGA) substrate. As illustrated in FIG. 10, the package substrate 70 has a first surface (for example, upper surface 70a) and a second surface (for example, lower surface 70b) located on the opposite side of the first surface. In the package substrate 70, a plurality of wirings is provided in multiple layers in the inside located between the upper surface 70a and the lower surface 70b. These wirings are connected to a plurality of terminals (for example, pin-like terminals 73) provided on the lower surface 70b of the package substrate 70.

Figure 11:
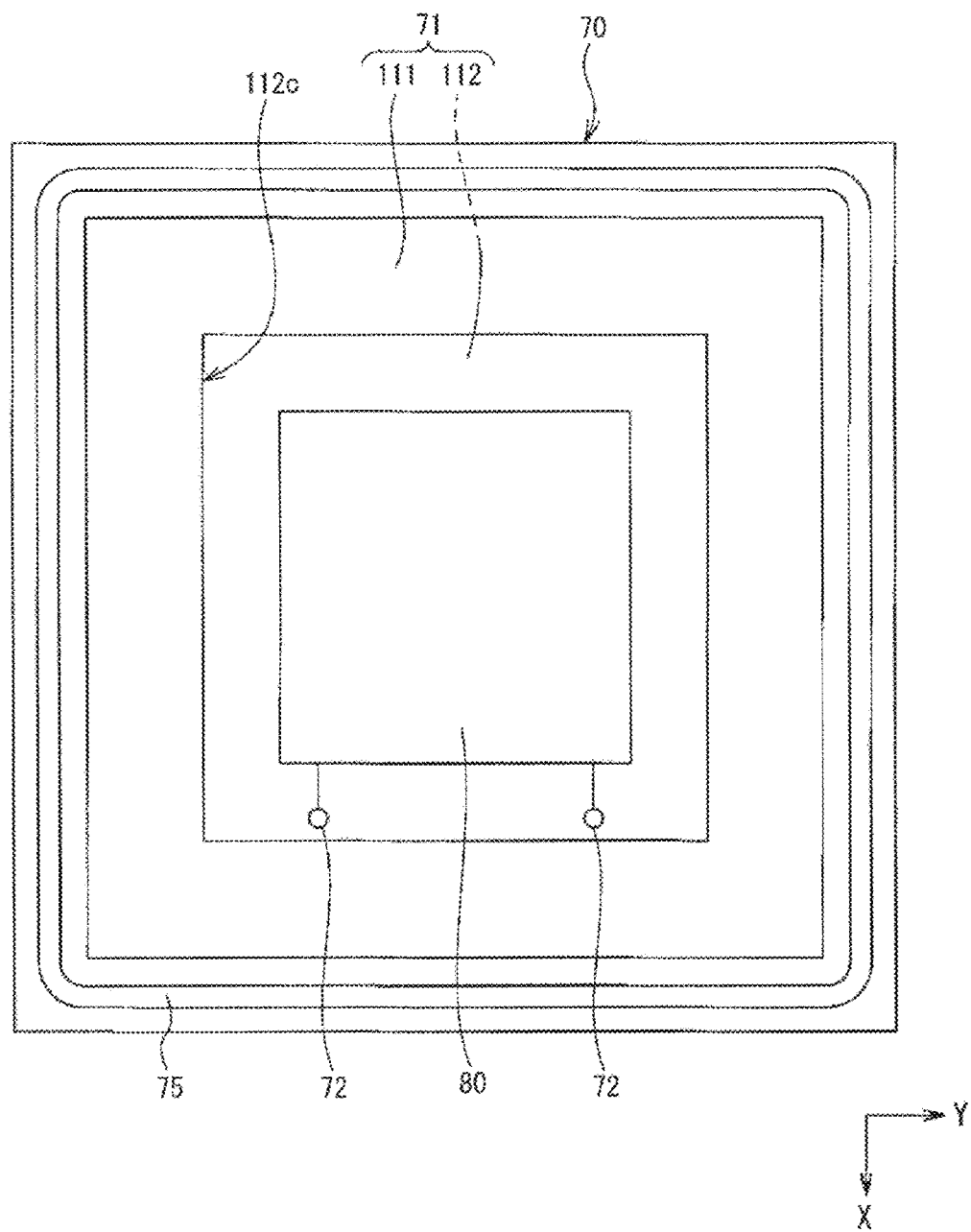
FIG. 11 is a plan view illustrating a configuration example of an upper surface side of a package substrate according to the first embodiment.

FIG. 11 is a plan view illustrating a configuration example of the upper surface side of the package substrate according to the first embodiment. As illustrated in FIGS. 10 and 11, a cavity 71 is provided on the upper surface 70a side of the package substrate 70. The cavity 71 has a first recess 111 and a second recess 112 (an example of a recess) provided on a bottom surface 111a of the first recess 111. Shapes of the first recess 111 and the second recess 112 in a plan view are, for example, rectangular. The first recess 111 has a diameter of an opening surface larger than that of the second recess 112.

The Peltier element 80 as a temperature control element is arranged in the second recess 112. For example, the Peltier element 80 is attached to a bottom surface 112a of the second recess 112 through an adhesive 51 (see FIG. 9). An upper surface (for example, an upper surface 85a of a second ceramic substrate 85 to be described later) of the Peltier element 80 arranged in the second recess 112 has the same height or substantially the same height as bottom surface 111a of first recess 111.

The bottom surface 112a of the second recess 112 is provided with the pin-like terminals 72 for connection with lead wires of the Peltier element 80. Two pin-like terminals 72 are provided. One of the two pin-like terminals 72 is connected to a positive lead wire of the Peltier element 80, and the other is connected to a negative lead wire of the Peltier element 80.

Note that an external connection terminal may be a ball terminal or a land terminal instead of the pin-like terminal 73.

As illustrated in FIGS. 9 to 11, a seal ring 75 is provided on the upper surface 70a side of an outer peripheral portion of the package substrate 70. The seal ring 75 is continuously provided so as to surround the cavity 71 of the package substrate 70 in a plan view. The seal ring 75 is a portion to be joined to a metal portion 63, which will be described later, of the lid 60 with sealing glass. The seal ring 75 is, for example, an alloy of iron (Fe)-nickel (Ni)-cobalt (Co) (so-called Kovar) which has been subjected to surface treatment by plating of Ni, gold (Au), or the like.

Figure 12:
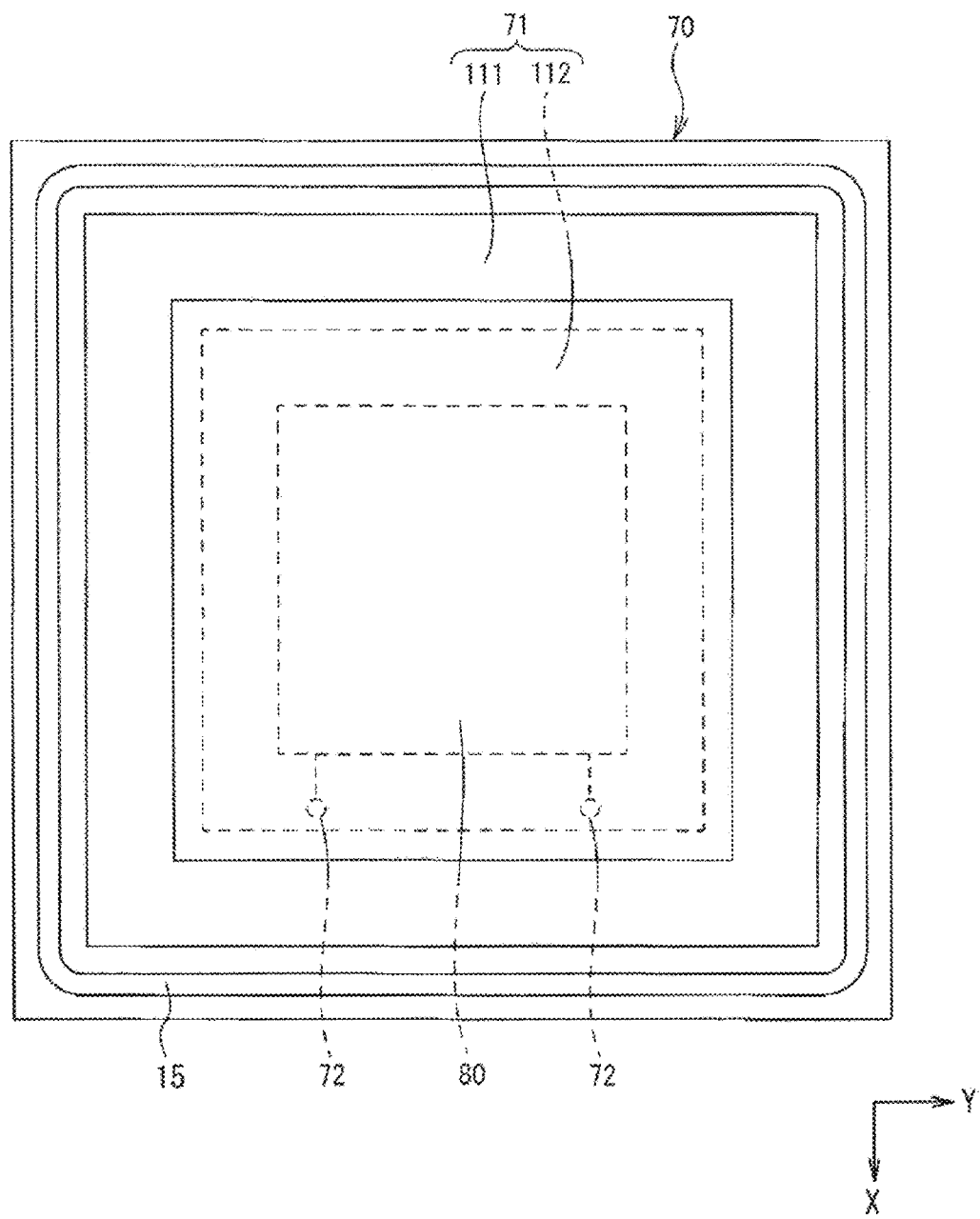
FIG. 12 is a plan view illustrating a positional relationship between the package substrate and a ceramic interposer substrate according to the first embodiment.

FIG. 12 is a plan view illustrating a positional relationship between the package substrate and the ceramic interposer substrate according to the first embodiment. As illustrated in FIG. 9, a lower surface 90b side of the ceramic interposer substrate 90 is attached to the bottom surface 111a of the first recess 111 and the Peltier element 80 through the adhesive 51. As illustrated in FIGS. 9 and 12, the ceramic interposer substrate 90 is arranged so as to entirely cover the opening surface of the second recess 112.

A plurality of bonding pads 74 is provided on the bottom surface 111a of the first recess 111 in a region exposed from below the ceramic interposer substrate 90. Furthermore, a plurality of bonding pads 91 is provided on the lower surface 90b side of the ceramic interposer substrate 90. At least a part of the plurality of bonding pads 91 is connected to the bonding pad 74 through a wire 54. Furthermore, at least a part of the plurality of bonding pads 91 is connected to a bonding pad 92 of the solid-state imaging apparatus 1 through a wire 55. Alternatively, both the wires 54 and 55 may be connected to one bonding pad 91. The wires 54 and 55 are, for example, gold wires.

The bonding pad 92 is provided in an outer peripheral region on an upper surface 93a side of the solid-state imaging apparatus 1. A lower surface 93b side of the solid-state imaging apparatus 1 is attached to the lower surface 90b side of the ceramic interposer substrate 90 through the adhesive 51.

Figure 13:
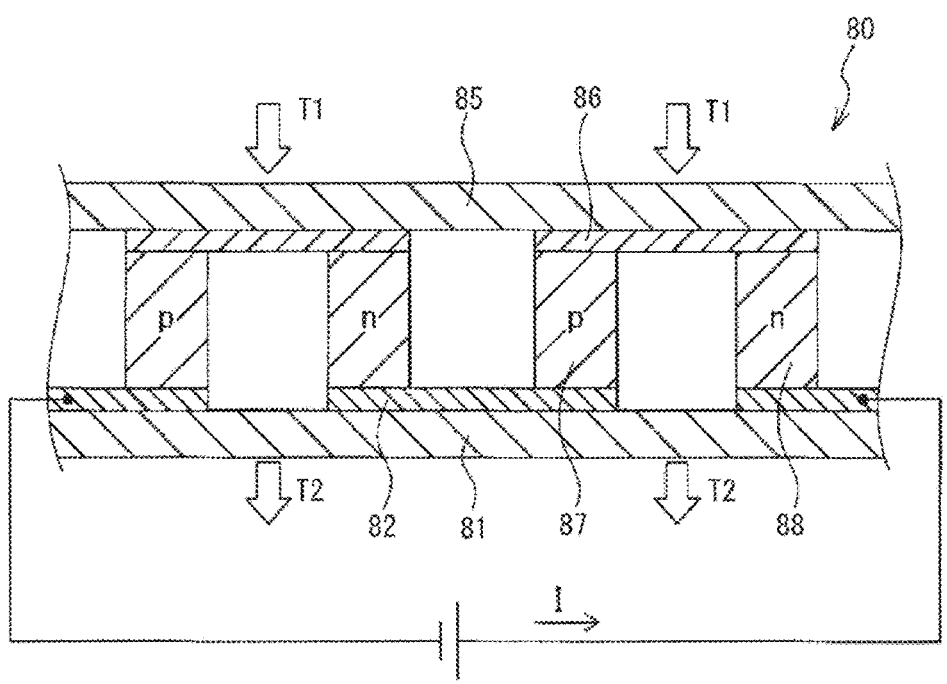
FIG. 13 is a cross-sectional view illustrating a configuration example of a Peltier element according to the first embodiment.

FIG. 13 is a cross-sectional view illustrating a configuration example of the Peltier element according to the first embodiment. As illustrated in FIG. 13, the Peltier element 80 includes a first ceramic substrate 81, first copper electrodes 82 provided on the first ceramic substrate 81, a second ceramic substrate 85 facing the first ceramic substrate 81, second copper electrodes 86 provided on the second ceramic substrate 85, P-type thermoelectric semiconductors 87, and N-type thermoelectric semiconductors 88. Each of the P-type thermoelectric semiconductor 87 and the N-type thermoelectric semiconductor 88 is arranged between the first ceramic substrate 81 and the second ceramic substrate 85. Each of the P-type thermoelectric semiconductor 87 and the N-type thermoelectric semiconductor 88 has one end connected to the first copper electrode 82, and the other end connected to the second copper electrode 86. The P-type thermoelectric semiconductors 87 and the N-type thermoelectric semiconductors 88 are alternately connected in series through the first copper electrodes 82 and the second copper electrodes 86.

When a direct current flows from the N-type thermoelectric semiconductor 88 in the Peltier element 80 as illustrated in FIG. 13, the second ceramic substrate 85 absorbs heat T1 (absorbs heat), and the first ceramic substrate 81 emits heat T2 (dissipates heat). The second ceramic substrate 85 is attached to the ceramic interposer substrate 90 through the adhesive 51, and the first ceramic substrate 81 is attached to the package substrate 70 through the adhesive 51. Thus, the Peltier element 80 can release heat generated by the solid-state imaging apparatus 1 or the like from the ceramic interposer substrate 90 to the package substrate 70.

Next, a configuration of the package 50 will be described. As illustrated in FIGS. 8 to 10, the lid 60 with sealing glass includes sealing glass 61, a ceramic frame 62 provided on a lower surface 61b side of an outer peripheral portion of the sealing glass 61, and the metal portion 63 provided on a lower surface 62b side of the ceramic frame 62. The sealing glass 61 and the ceramic frame 62 are joined to each other by, for example, low-melting-point glass. The ceramic frame 62 and the metal portion 63 are joined to each other by, for example, an Ag—Cu brazing material or the like.

The metal portion 63 is a portion to be joined to the seal ring 75 of the package substrate 70 by means such as seam welding. The metal portion 63 includes the same material as the seal ring 75, and is, as an example, an alloy of iron (Fe)-nickel (Ni)-cobalt (Co) (so-called Kovar) which has been subjected to surface treatment by plating of Ni, gold (Au), or the like. The lid 60 with sealing glass is joined to an upper surface 50a side of the package 50, and airtightly seals the upper surface 50a side of the package 50.

2.6 Regarding Temperature Control Mechanism

In the solid-state imaging apparatus 1 using the photoelectric conversion material having a smaller band gap energy than silicon, in other words, having sensitivity to light having a wavelength of about 1200 nm or more as described above, it is necessary to provide the mechanism (temperature control mechanism) for cooling the sensor chip or keeping the sensor chip at a constant temperature in order to suppress the generation of the dark current which is the noise as described above.

However, in a configuration in which the discrete thermistor element is attached to the solid-state imaging apparatus 1 and the temperature control circuit arranged outside the package controls the Peltier element in the package on the basis of the output from the thermistor element, there are problems in terms of the accuracy of the measured sensor chip temperature, the robustness of the measured temperature, the restriction of the number of terminals, the yield, and the like as described above.

Therefore, the present embodiment has a configuration in which a thermometer circuit is arranged in the solid-state imaging apparatus 1, and the Peltier element in the package can be controlled from the temperature control circuit arranged outside the package on the basis of an output from the thermometer circuit. This makes it possible to obtain advantages in terms of the accuracy of the measured sensor chip temperature, the robustness of the measured temperature, the restriction of the number of terminals, the yield, and the like.

2.7 Regarding Position of Temperature Sensor (Thermometer Circuit)

As illustrated in FIG. 9, a thermometer circuit 120 as a temperature sensor according to the present embodiment is incorporated in, for example, the circuit board 200 of the solid-state imaging apparatus 1. A current or a voltage that is a measurement result output from the thermometer circuit 120 is output to the outside of the sensor package 1100 through, for example, the bonding pad 91, the wire 54, the bonding pad 74, and the pin-like terminal 73.

Note that it may be configured such that, as illustrated in FIG. 9, an AD conversion circuit 121 that converts an analog current or voltage value output from the thermometer circuit 120 into a digital value is provided in the circuit board 200, and the digital value output from the AD conversion circuit 121 is output to the outside of the sensor package 1100 through the pin-like terminal 73 or the like. In that case, as the AD conversion circuit 121, the ADC 40a in the horizontal selection circuit 40 may be used, or a dedicated ADC incorporated in the circuit board 200 separately from the ADC 40a may be used.

Furthermore, the thermometer circuit 120 may be provided on the light receiving board 100 side, for example, without being limited to the circuit board 200.

2.8 Schematic Configuration Example of Imaging System

Next, an imaging system including the temperature control mechanism according to the present embodiment will be described with some examples. Note that a case where the AD conversion circuit 121 that converts an output from the thermometer circuit 120 into a digital value is provided in the solid-state imaging apparatus 1 will be exemplified in the following description.

2.8.1 First System Configuration Example

Figure 14:
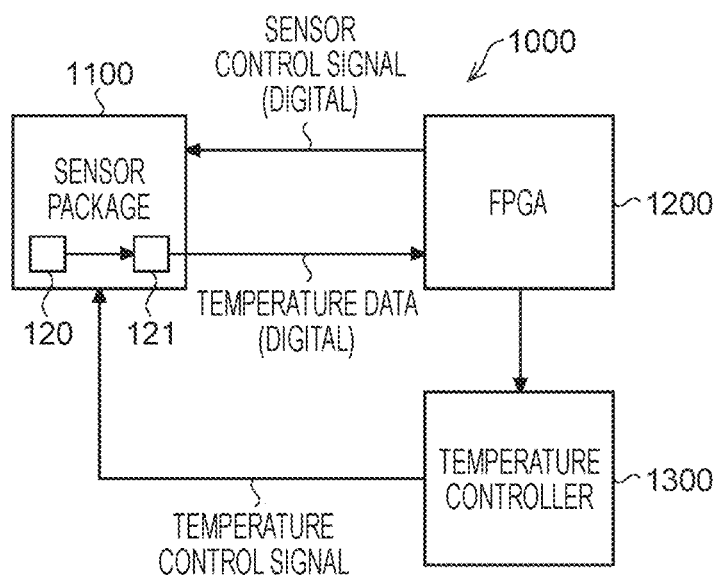
FIG. 14 is a block diagram illustrating a schematic configuration example of an imaging system according to a first system configuration example of the first embodiment.

FIG. 14 is a block diagram illustrating a schematic configuration example of an imaging system according to a first system configuration example of the first embodiment. As illustrated in FIG. 14, an imaging system 1000 according to the first system configuration example includes the above-described sensor package 1100, a field-programmable gate array (FPGA) 1200, and a temperature controller 1300.

As described above, the sensor package 1100 has a structure in which the solid-state imaging apparatus 1 is accommodated in the cavity 71 formed by the package 50 and the lid 60 with sealing glass.

The FPGA 1200 is, for example, a controlling apparatus configured to control the solid-state imaging apparatus 1, and inputs a control signal for controlling the solid-state imaging apparatus 1 to the solid-state imaging apparatus 1 inside the package 50 through the pin-like terminal. As an interface connecting the FPGA 1200 and the solid-state imaging apparatus 1, an inter-integrated circuit (I2C), a serial peripheral interface (SPI), or the like can be used as described above. Note that an information processing apparatus such as an image signal processor (ISP) may be used instead of the FPGA 1200.

Temperature data (a detection result), detected by the thermometer circuit 120 of the solid-state imaging apparatus 1 and converted into a digital value by the AD conversion circuit 121, is output to the FPGA 1200 outside the package, for example, through the same interface as the interface such as I2C or SPI connecting the FPGA 1200 and the solid-state imaging apparatus 1. Therefore, a dedicated line or a dedicated terminal for outputting the temperature data to the outside of the package can be omitted in the present embodiment.

The temperature controller 1300 is configured to control the Peltier element 80 in the sensor package 1100 according to a control signal from the FPGA 1200, for example. Specifically, the temperature controller 1300 generates a current waveform to be applied to the Peltier element 80 according to the control signal from the FPGA 1200, and supplies the current waveform to the Peltier element 80 in the sensor package 1100 through the pin-like terminal 73.

Since the thermometer circuit 120 is arranged in the solid-state imaging apparatus 1 according to the above configuration, it is possible to directly measure the temperature of the solid-state imaging apparatus 1 itself. This makes it possible to increase the accuracy of the measured sensor chip temperature.

Furthermore, for example, the analog value output from the thermometer circuit 120 is converted into the digital value by the AD conversion circuit 121 in the solid-state imaging apparatus 1, and thus, it is possible to reduce the influence of noise on the measurement result detected by the thermometer circuit 120. This makes it possible to increase the robustness of the measured temperature.

Moreover, the measurement result can be output to the outside of the sensor package 1100 using the control signal of I2C, SPI, or the like by converting the measurement result into the digital value, and thus, it is unnecessary to provide the dedicated terminal for outputting the measurement result to the outside of the sensor package 1100. This makes it possible to output the measurement result to the outside without being restricted by the number of terminals for the sensor package 1100.

Moreover, a separate component is not attached to the solid-state imaging apparatus 1 in this configuration as in the discrete thermistor element, and thus, it is possible to suppress a decrease in yield caused by a defect of the thermistor element, an attachment defect, or the like.

2.8.2 Second System Configuration Example

Figure 15:
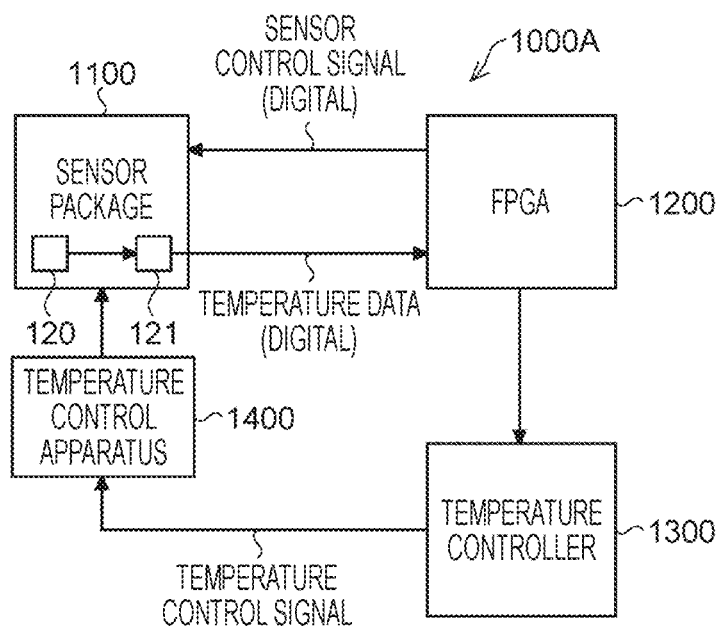
FIG. 15 is a block diagram illustrating a schematic configuration example of an imaging system according to a second system configuration example of the first embodiment.

FIG. 15 is a block diagram illustrating a schematic configuration example of an imaging system according to a second system configuration example of the first embodiment. In an imaging system 1000A according to a second system configuration example as illustrated in FIG. 15, a temperature control apparatus 1400 is added in a configuration similar to that of the imaging system 1000 according to the first system configuration example. Furthermore, the Peltier element 80 mounted in the sensor package 1100 in the first system configuration example can be omitted in the second system configuration example.

The temperature control apparatus 1400 is a mechanism for controlling the temperature of the solid-state imaging apparatus 1 in the sensor package 1100 instead of the Peltier element 80 in the sensor package 1100. As the temperature control apparatus 1400, for example, various temperature control apparatuses such as a cooling element such as a Peltier element joined to the outer surface of the sensor package 1100, a heat sink, an air cooling apparatus, and a water cooling apparatus can be used. Accordingly, in the second system configuration example, the temperature controller 1300 controls the temperature control apparatus 1400 to control the temperature of the solid-state imaging apparatus 1 inside the sensor package 1100 from the outside of the sensor package 1100.

In this manner, even in the case where the configuration for controlling the temperature of the solid-state imaging apparatus 1 is provided outside the sensor package 1100, it is possible to achieve effects similar to those of the first system configuration example.

Note that the case where the temperature controller 1300 is arranged outside the sensor package 1100 has been exemplified in the first and second system configuration examples described above, the present invention is not limited thereto, and the temperature controller 1300 may be partially or entirely arranged in the sensor package 1100. In that case, the temperature controller 1300 may be partially or entirely arranged on the circuit board 200 of the solid-state imaging apparatus 1.

2.9 Arrangement Example of Thermometer Circuit

Next, an arrangement of the thermometer circuit 120 in the solid-state imaging apparatus 1 will be described with some examples. Note that the horizontal selection circuit 40 and the horizontal drive circuit 30 will be collectively described as a horizontal circuit 40A in the following description for the sake of clarity.

2.9.1 First Example

Figure 16:
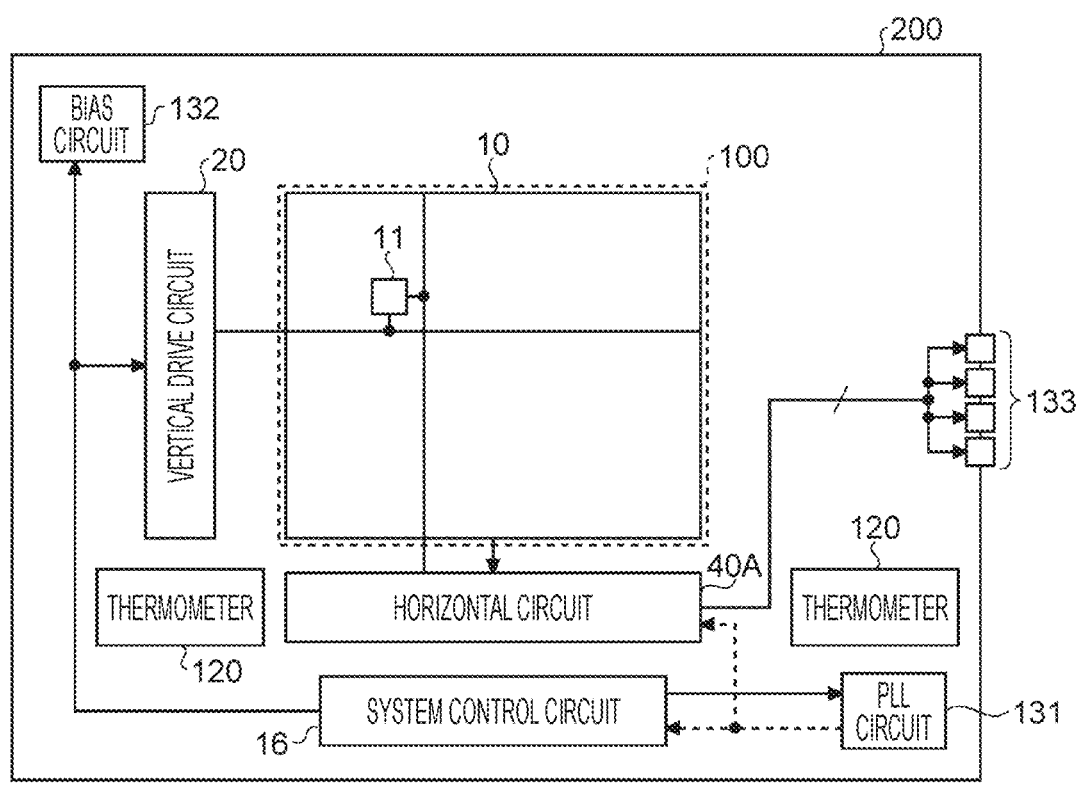
FIG. 16 is a layout diagram for describing an arrangement of a thermometer circuit according to a first example of the first embodiment.

FIG. 16 is a layout diagram for describing an arrangement of the thermometer circuit according to a first example of the first embodiment. In the layout illustrated in FIG. 16, portions mainly generating heat are the horizontal circuit 40A, the system control circuit 16, and the like in the circuit board 200. Therefore, in the first example, the thermometer circuit 120 is arranged in the vicinity of the horizontal circuit 40A, the system control circuit 16, and the like which are the portions mainly generating heat as illustrated in FIG. 16.

Furthermore, the number of the thermometer circuits 120 to be arranged is not limited to one, and may be plural as illustrated in FIG. 16. When the plurality of thermometer circuits 120 is arranged dispersedly, it is possible to measure a more accurate temperature of the solid-state imaging apparatus 1. However, in a case where a material having a high thermal conductivity, such as a silicon substrate, is used for the circuit board 200, sufficient accuracy can be obtained even with the single thermometer circuit 120.

Note that the thermometer circuit 120, the AD conversion circuit 121 connected thereto, or a register that holds temperature data generated by the AD conversion circuit 121 is also connected to a terminal 133 for inputting a control signal to the solid-state imaging apparatus 1 and outputting image data generated by the solid-state imaging apparatus 1. This may be similarly applied to other examples to be described later.

2.9.2 Second Example

Figure 17:
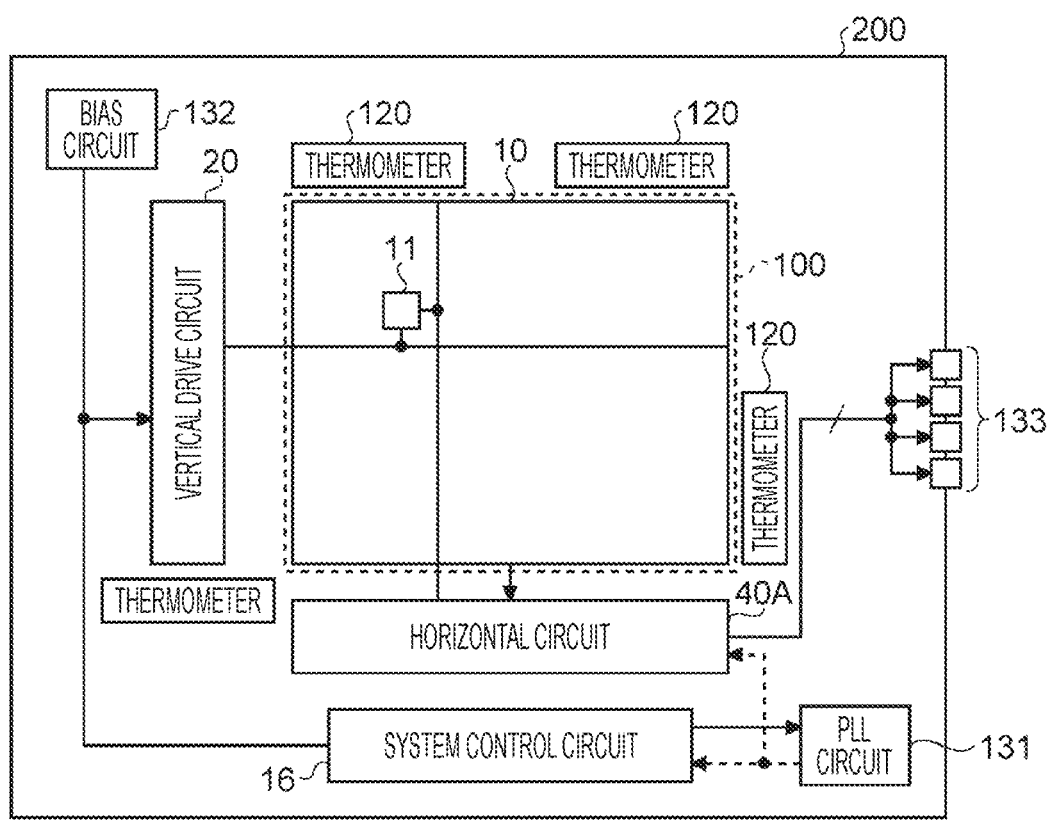
FIG. 17 is a diagram for describing an arrangement of the thermometer circuit according to a second example of the first embodiment.

FIG. 17 is a diagram for describing an arrangement of the thermometer circuit according to a second example of the first embodiment. As illustrated in FIG. 17, the thermometer circuit 120 may be arranged in the vicinity of the light receiving board 100 configured for temperature control. However, there is a possibility that the uniformity of the pixels is impaired by the light from the thermometer circuit 120 when the thermometer circuit 120 and the light receiving board 100 overlap each other as described above, and thus, the thermometer circuit 120 may be arranged in a region that is in the vicinity of the light receiving board 100 and does not overlap the light receiving board 100.

At that time, the temperature distribution and the like of the light receiving board 100 can also be measured by arranging the plurality of thermometer circuits 120 so as to surround the light receiving board 100, and thus, more accurate temperature control of the solid-state imaging apparatus 1 can be executed.

2.9.3 Third Example

Figure 18:
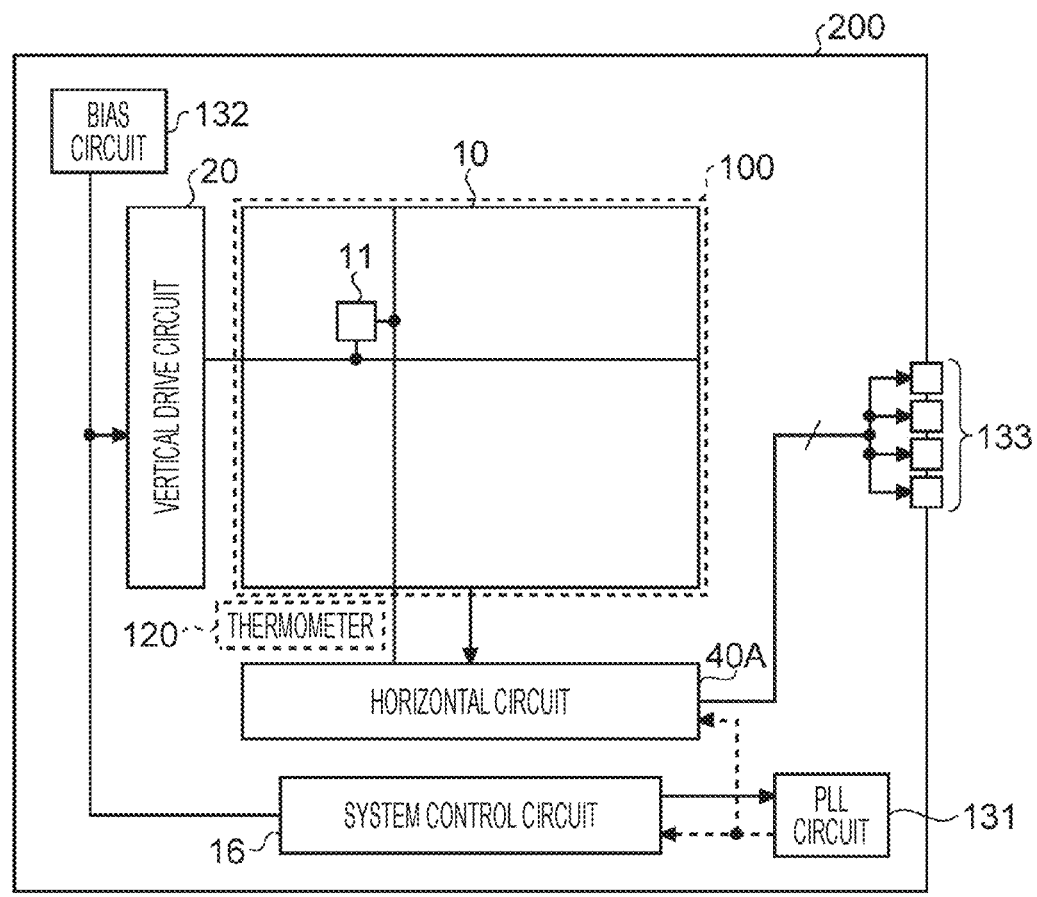
FIG. 18 is a diagram for describing an arrangement of the thermometer circuit according to a third example of the first embodiment.

FIG. 18 is a diagram for describing an arrangement of the thermometer circuit according to a third example of the first embodiment. As illustrated in FIG. 18, the thermometer circuit 120 may be arranged between each of the horizontal circuit 40A, the system control circuit 16, and the like, which are the portions mainly generating heat, and the light receiving board 100 configured for temperature control. As a result, it is possible to start cooling by driving the Peltier element 80 before heat generated in the horizontal circuit 40A, the system control circuit 16, and the like is transferred to the light receiving board 100, and thus, more accurate temperature control can be performed.

Note that, in any of the above-described first to third examples and other examples whose description is omitted, the thermometer circuit 120 is preferably arranged at a position overlapping the Peltier element 80 in the substrate thickness direction of the solid-state imaging apparatus 1. As a result, the temperature controlled by the Peltier element 80 can be quickly detected, and thus, more accurate temperature control can be performed.

2.10 Example of Thermometer Circuit

Figure 19:
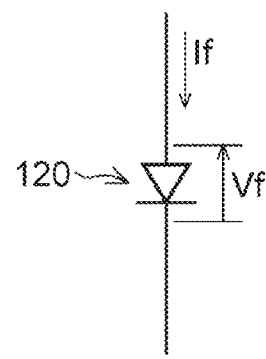
FIG. 19 is a circuit diagram illustrating an example of the thermometer circuit according to the first embodiment.

Here, the thermometer circuit 120 according to the present embodiment will be described with an example. FIG. 19 is a circuit diagram illustrating the example of the thermometer circuit according to the first embodiment. As illustrated in FIG. 19, for example, a silicon diode can be used for the thermometer circuit 120.

The silicon diode has characteristics that a forward voltage (corresponding to the film voltage) Vf has a temperature coefficient of −2 mV/° C., and Vf decreases linearly as the temperature increases, so that there is an advantage that the temperature can be easily specified from a voltage value of Vf. Furthermore, since such characteristics are provided, there is also an advantage that calibration can be performed at the time of manufacturing the solid-state imaging apparatus 1. Moreover, the silicon diode can be formed by the same process as each transistor of the pixel circuit 14, and thus, it is unnecessary to newly add processing for forming the thermometer circuit 120, and there is also an advantage that complication of a manufacturing process can be suppressed.

However, the thermometer circuit 120 according to the present embodiment can use various temperature sensors that can be incorporated into the circuit board 200, for example, a semiconductor temperature sensor, such as a PNP transistor, and the like without being limited to the silicon diode.

2.11 Temperature Control Flow

Next, a temperature control flow according to the present embodiment will be described with some examples.

As a flow of controlling the temperature of the solid-state imaging apparatus 1, for example, it is possible to consider a method of acquiring temperature data periodically in the solid-state imaging apparatus 1 to record a value thereof in a register and accessing the register as necessary from the outside (for example, the FPGA 1200) to acquire the temperature data, and a method of acquiring temperature data in the solid-state imaging apparatus 1 in response to a request from the outside (for example, the FPGA 1200) to record a value of the temperature data in a register and accessing the register from the outside (for example, the FPGA 1200) to acquire the temperature data.

Therefore, in the following description, the former will be described as a first flow example, and the latter will be described as a second flow example. However, the temperature control flow according to the present disclosure is not limited thereto. Furthermore, attention is paid to the operation of the solid-state imaging apparatus 1 in the following description.

2.11.1 First Flow Example

Figure 20:
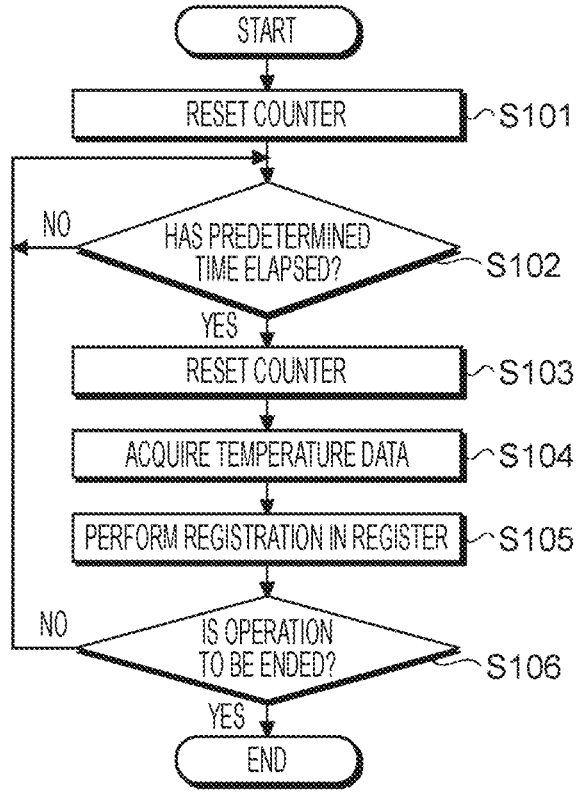
FIG. 20 is a flowchart illustrating an example of a temperature control flow according to a first flow example of the first embodiment.

FIG. 20 is a flowchart illustrating an example of the temperature control flow according to the first flow example of the first embodiment. In the first flow example, the solid-state imaging apparatus 1 first resets a counter for measuring an elapsed time as illustrated in FIG. 20 (step S101). This counter may be, for example, a counter that measures an elapsed time by counting a clock supplied from the system control circuit 16.

Next, the solid-state imaging apparatus 1 waits until a predetermined time elapses on the basis of a value of the counter (NO in step S102). Thereafter, when a predetermined time has elapsed (YES in step S102), the solid-state imaging apparatus 1 resets the counter (step S103).

Next, the solid-state imaging apparatus 1 converts an analog current or voltage output from the thermometer circuit 120 into digital temperature data by the AD conversion circuit 121 to acquire the temperature data (step S104), and registers the acquired temperature data in a register (not illustrated) (step S105). This register may be a register accessible from the FPGA 1200 outside the sensor package 1100. Accordingly, the FPGA 1200 accesses the register periodically (for example, 30 times/second) or as necessary, acquires the temperature data registered in the register, and inputs a control signal to the temperature controller 1300.

Thereafter, the solid-state imaging apparatus 1 determines whether or not to end the present operation (step S106), and ends the present operation in a case where the present operation is to be ended (YES in step S106). On the other hand, in a case where the present operation is not to be ended (NO in step S106), the solid-state imaging apparatus 1 returns to step S102 and executes operations in step S102 and subsequent steps.

2.11.2 Second Flow Example

Figure 21:
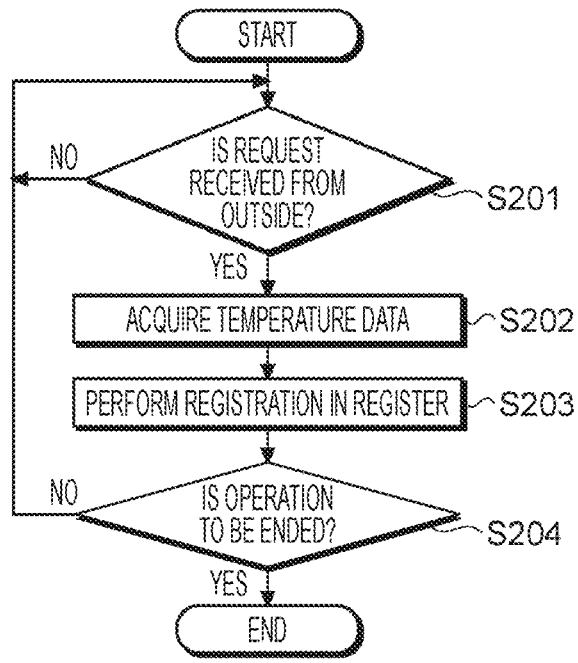
FIG. 21 is a flowchart illustrating an example of a temperature control flow according to a second flow example of the first embodiment.

FIG. 21 is a flowchart illustrating an example of the temperature control flow according to the second flow example of the first embodiment. In the second flow example, the solid-state imaging apparatus 1 first waits until a request for temperature data is received from, for example, the FPGA 1200 on the outside (NO in step S201) as illustrated in FIG. 21.

Thereafter, when the request for the temperature data is received (YES in step S201), the solid-state imaging apparatus 1 converts an analog current or voltage output from the thermometer circuit 120 into digital temperature data by the AD conversion circuit 121 to acquire the temperature data (step S202), and registers the acquired temperature data in the register (not illustrated) (step S203) similarly to steps S104 to S105 in FIG. 20. This register may be a register accessible from the FPGA 1200 outside the sensor package 1100. Accordingly, the FPGA 1200 and/or other external apparatuses that have requested the temperature data access the register, acquire the temperature data registered therein, and input a control signal to the temperature controller 1300.

Thereafter, the solid-state imaging apparatus 1 determines whether or not to end the present operation (step S204), and ends the present operation in a case where the present operation is to be ended (YES in step S204). On the other hand, in a case where the present operation is not to be ended (NO in step S204), the solid-state imaging apparatus 1 returns to step S201 and executes operations in step S201 and subsequent steps.

3. Application Example

Application Example 1

A technology according to the present disclosure (present technology) can be applied to various products. For example, the technology according to the present disclosure may be realized as an apparatus mounted on any type of mobile body such as an automobile, an electric vehicle, a hybrid electric vehicle, a motorcycle, a bicycle, a personal mobility, an airplane, a drone, a ship, or a robot.

Figure 22:
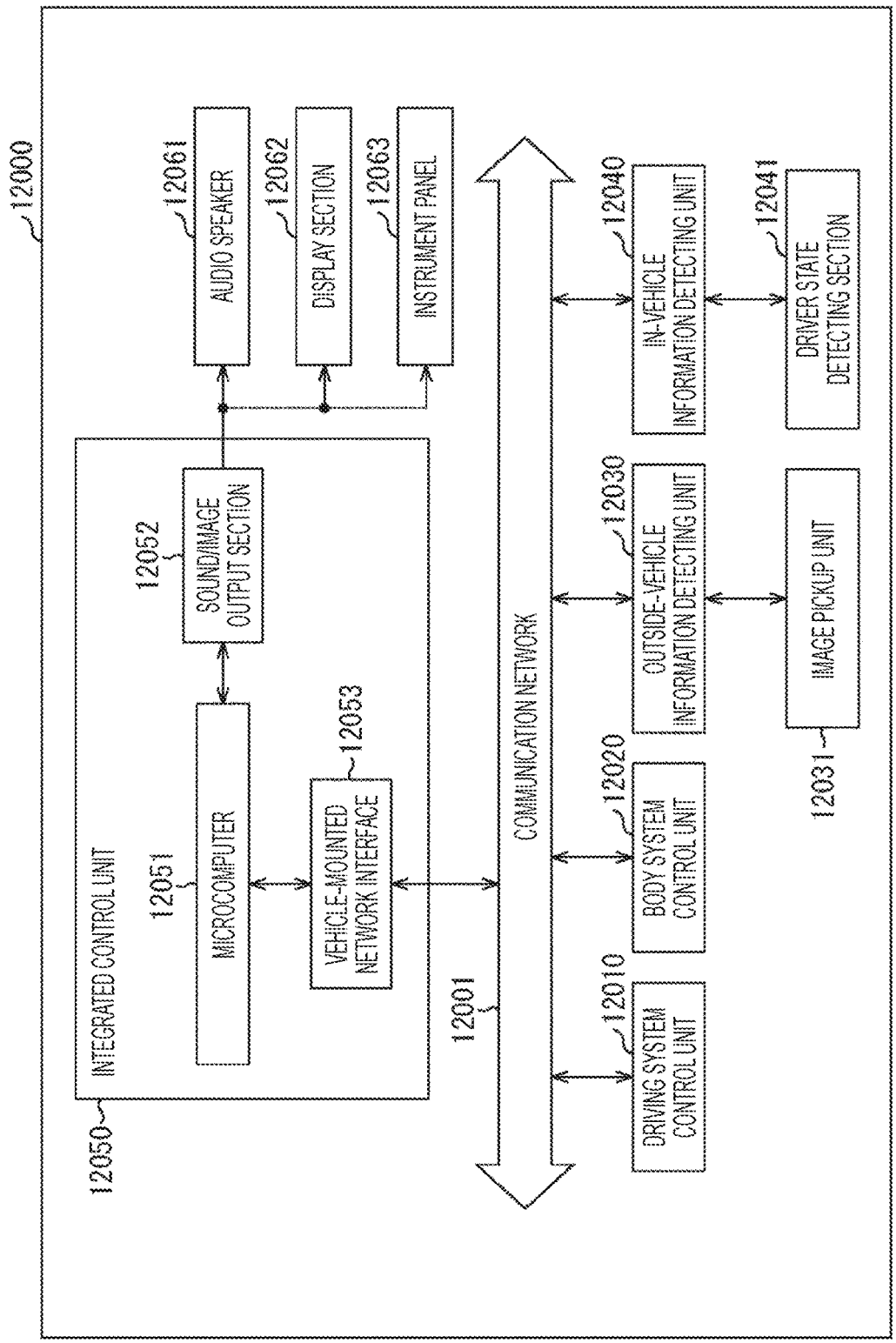
FIG. 22 is a block diagram illustrating a schematic configuration example of a vehicle control system as an example of a mobile body control system to which a technology according to the present disclosure can be applied.

FIG. 22 is a block diagram illustrating an example of a schematic configuration of a vehicle control system as an example of a mobile body control system to which the technology according to the present disclosure can be applied.

The vehicle control system 12000 includes a plurality of electronic control units connected to each other through a communication network 12001. In the example illustrated in FIG. 22, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as functional configurations of the integrated control unit 12050.

The driving system control unit 12010 controls operations of apparatuses related to a driving system of a vehicle in accordance with various kinds of programs. For example, the driving system control unit 12010 functions as a controlling apparatus for a driving force generating apparatus for generating a driving force of the vehicle, such as an internal combustion engine and a driving motor, a driving force transmitting mechanism for transmitting the driving force to wheels, a steering mechanism for adjusting a steering angle of the vehicle, a braking apparatus for generating a braking force of the vehicle, or the like.

The body system control unit 12020 controls operations of various kinds of apparatuses provided to a vehicle body in accordance with various kinds of programs. For example, the body system control unit 12020 functions as a controlling apparatus for a keyless entry system, a smart key system, a power window apparatus, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an image pickup unit 12031. The outside-vehicle information detecting unit 12030 makes the image pickup unit 12031 picks up an image of the outside of the vehicle, and receives the picked up image. The outside-vehicle information detecting unit 12030 may perform processing of detecting an object such as a human, a vehicle, an obstacle, a sign, a character on a road surface, or the like, or processing of detecting a distance thereto on the basis of the received image.

The image pickup unit 12031 is an optical sensor that receives light, and which outputs an electric signal corresponding to a received light amount of the light. The image pickup unit 12031 can output the electric signal as an image or as information about a measured distance. Furthermore, the light received by the image pickup unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that picks up the driver. The in-vehicle information detecting unit 12040 may calculate a degree of fatigue or a degree of concentration of the driver on the basis of detection information input from the driver state detecting section 12041, or may determine whether the driver is dozing.

The microcomputer 12051 can calculate a control target value for the driving force generating apparatus, the steering mechanism, or the braking apparatus on the basis of the information about the inside or outside of the vehicle of which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) of which functions include collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 12051 can perform cooperative control intended for automatic driving, which makes the vehicle to travel autonomously without depending on the operation of the driver, or the like, by controlling the driving force generating apparatus, the steering mechanism, the braking apparatus, or the like on the basis of the information about the outside or inside of the vehicle of which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle of which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output apparatus capable of visually or auditorily notifying an occupant of the vehicle or the outside of the vehicle of information. In the example of FIG. 22, an audio speaker 12061, a display section 12062, and an instrument panel 12063 are illustrated as the output apparatus. The display section 12062 may, for example, include at least one of an on-board display or a head-up display.

Figure 23:
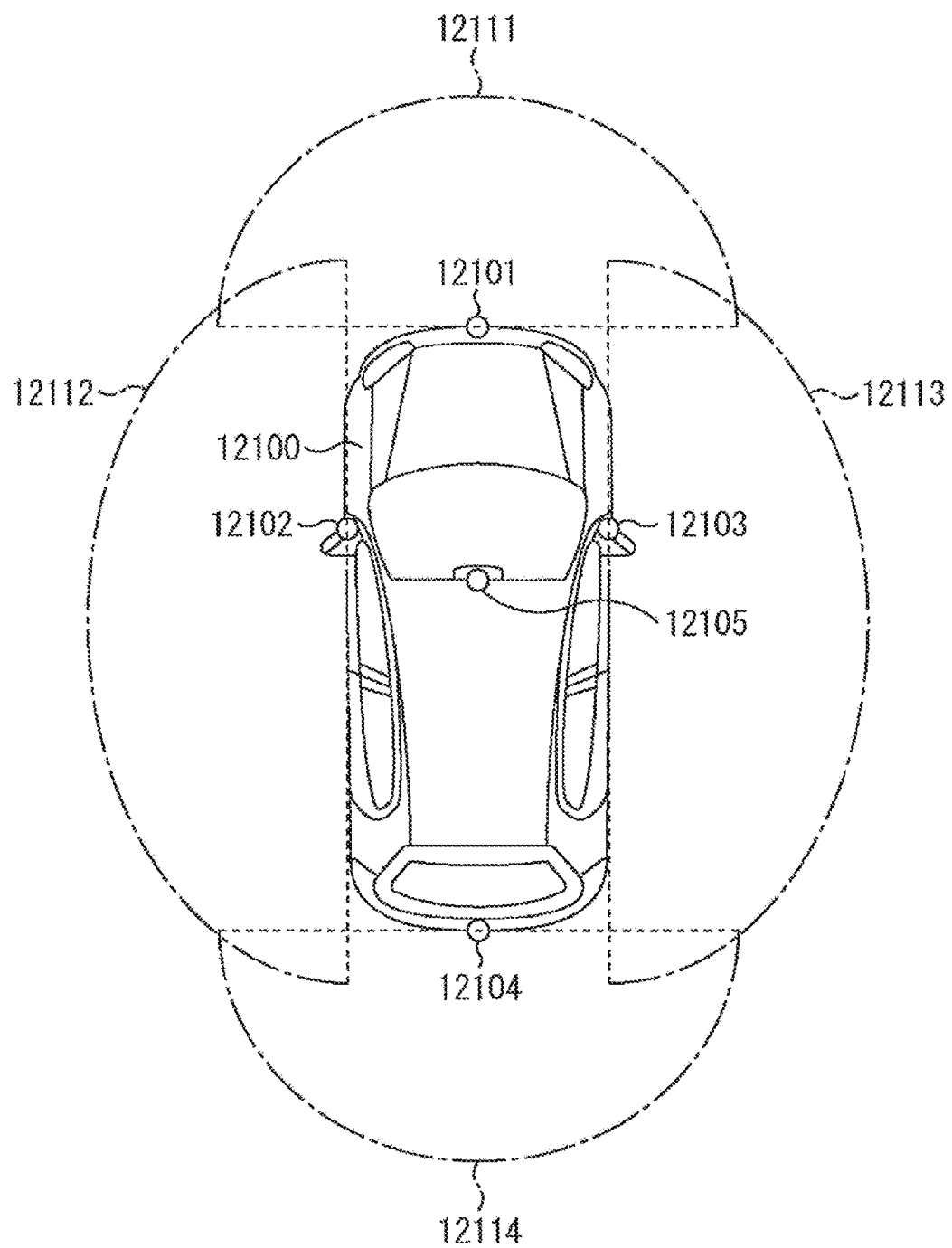
FIG. 23 is a view illustrating an example of an installation position of an image pickup unit illustrated in FIG. 22.

FIG. 23 is a view illustrating an example of an installation position of the image pickup unit 12031.

In FIG. 23, a vehicle 12100 includes image pickup units 12101, 12102, 12103, 12104, and 12105 as the image pickup unit 12031.

The image pickup units 12101, 12102, 12103, 12104, and 12105 are, for example, provided at positions on a front nose, sideview mirrors, a rear bumper, and a back door of the vehicle 12100 as well as a position on an upper portion of a windshield within the interior of the vehicle. The image pickup unit 12101 provided to the front nose and the image pickup unit 12105 provided to the upper portion of the windshield within the interior of the vehicle obtain mainly an image of the front of the vehicle 12100. The image pickup units 12102 and 12103 provided to the sideview mirrors obtain mainly images of the sides of the vehicle 12100. The image pickup unit 12104 provided to the rear bumper or the back door obtains mainly an image of the rear of the vehicle 12100. The image of the front acquired by the image pickup units 12101 and 12105 is mainly used to detect a preceding vehicle, a pedestrian, an obstacle, a traffic light, a traffic sign, a lane, or the like.

Note that FIG. 23 illustrates examples of imaging ranges of the image pickup units 12101 to 12104. An imaging range 12111 represents the imaging range of the image pickup unit 12101 provided to the front nose. Imaging ranges 12112 and 12113 respectively represent the imaging ranges of the image pickup units 12102 and 12103 provided to the sideview mirrors. An imaging range 12114 represents the imaging range of the image pickup unit 12104 provided to the rear bumper or the back door. A bird's-eye image of the vehicle 12100 as viewed from above is obtained by superimposing pieces of image data picked up by the image pickup units 12101 to 12104, for example.

At least one of the image pickup units 12101 to 12104 may have a function of obtaining distance information. For example, at least one of the image pickup units 12101 to 12104 may be a stereo camera including a plurality of image pickup elements, or may be an image pickup element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the image pickup units 12101 to 12104, and thereby extract, as a preceding vehicle, a nearest three-dimensional object in particular which is present on a traveling path of the vehicle 12100 and which travels in substantially the same direction as the vehicle 12100 at a predetermined speed (for example, equal to or more than 0 km/hour). Moreover, the microcomputer 12051 can set a following distance to be maintained in front of a preceding vehicle in advance, and perform automatic brake control (including following stop control), automatic acceleration control (including following start control), or the like. In this manner, it is possible to perform cooperative control intended for automatic driving for autonomous traveling without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole on the basis of the distance information obtained from the image pickup units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult to recognize visually. Then, the microcomputer 12051 determines a collision risk indicating a risk of collision with each obstacle, outputs a warning to the driver through the audio speaker 12061 or the display section 12062 in a situation in which the collision risk is equal to or higher than a set value and there is thus a possibility of collision, and performs forced deceleration or avoidance steering through the driving system control unit 12010, so that it is possible to assist in driving to avoid collision.

At least one of the image pickup units 12101 to 12104 may be an infrared camera that detects infrared rays. The microcomputer 12051 can, for example, recognize a pedestrian by determining whether or not there is a pedestrian in picked up images of the image pickup units 12101 to 12104. Such recognition of a pedestrian is, for example, performed by a procedure of extracting characteristic points in the picked up images of the image pickup units 12101 to 12104 as infrared cameras and a procedure of determining whether or not it is the pedestrian by performing pattern matching processing on a series of characteristic points representing the contour of the object. When the microcomputer 12051 determines that there is a pedestrian in the picked up images of the image pickup units 12101 to 12104, and thus recognizes the pedestrian, the sound/image output section 12052 controls the display section 12062 so that a square contour line for emphasis is displayed in an overlapping manner on the recognized pedestrian. Furthermore, the sound/image output section 12052 may also control the display section 12062 so that an icon or the like representing the pedestrian is displayed at a desired position.

An example of the mobile body control system to which the technology according to the present disclosure can be applied has been described as above. The technology according to the present disclosure can be applied to the image pickup unit 12031 among the configurations described above. Specifically, the solid-state imaging apparatus 1 can be applied to the image pickup unit 12031. Since it is possible to obtain the picked up image with high image quality by applying the technology according to the present disclosure to the image pickup unit 12031, it is possible to perform highly accurate control using the picked up image in the mobile body control system.

Application Example 2

Figure 24:
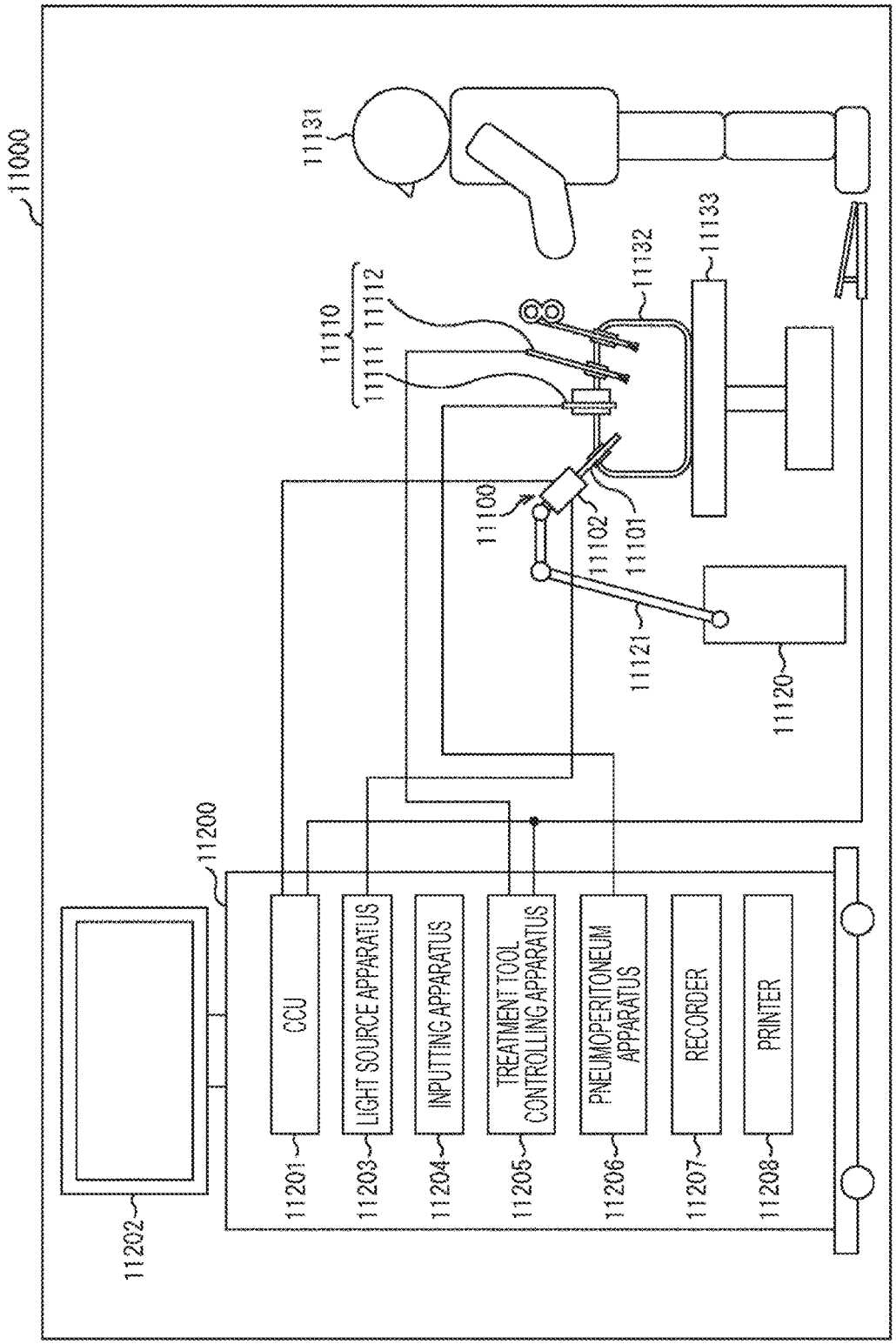
FIG. 24 is a diagram illustrating an example of a schematic configuration of an endoscopic surgery system to which the technology according to the present disclosure can be applied.

FIG. 24 is a view illustrating an example of a schematic configuration of an endoscopic surgery system to which the technology according to the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As illustrated in the drawing, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatuses for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. Although the endoscope 11100 configured as a rigid endoscope having the lens barrel 11101 of the hard type is illustrated in the illustrated example, but the endoscope 11100 may otherwise be configured as a flexible endoscope having the lens barrel of the flexible type.

The lens barrel 11101 has, at the distal end thereof, an opening in which an objective lens is fitted. A light source apparatus 11203 is connected to the endoscope 11100 such that light generated by the light source apparatus 11203 is introduced to the distal end of the lens barrel by a light guide extending in the inside of the lens barrel 11101 and is emitted toward an observation target in a body cavity of the patient 11132 through the objective lens. Note that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operations of the endoscope 11100 and a display apparatus 11202. Moreover, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds a gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image, and a graph.

Note that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Furthermore, in this case, if laser beams from the respective RGB laser light sources are emitted time-divisionally on an observation target and driving of the image pickup elements of the camera head 11102 are controlled in synchronism with the irradiation timings. Then images individually corresponding to the R, G, and B colors can be also picked up time-divisionally. According to this method, a color image can be obtained even if color filters are not provided for the image pickup element.

Furthermore, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Furthermore, the light source apparatus 11203 may be configured to supply light of a predetermined wavelength band ready for special light observation. In special light observation, for example, by utilizing the wavelength dependency of absorption of light in a body tissue to emit light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation with excitation light may be performed. In fluorescent observation, it is possible to perform observation of fluorescent light from a body tissue by irradiating the body tissue with excitation light (auto-fluorescence observation) or to obtain a fluorescent light image by locally injecting a reagent such as indocyanine green (ICG) into a body tissue and irradiating the body tissue with excitation light corresponding to a fluorescent light wavelength of the reagent. The light source apparatus 11203 can be configured to supply such narrow-band light and/or excitation light suitable for special light observation as described above.

Figure 25:
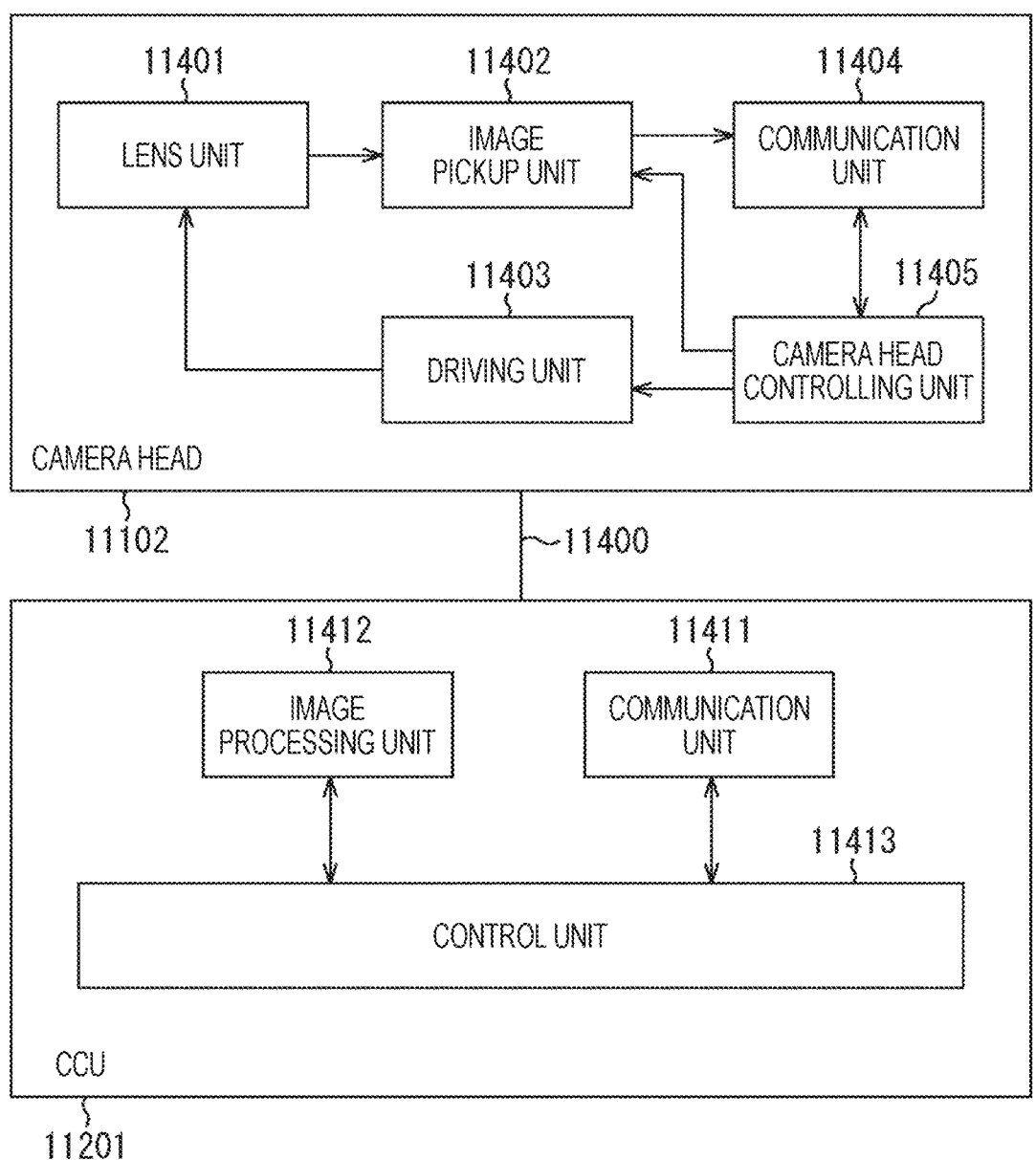
FIG. 25 is a block diagram illustrating examples of functional configurations of a camera head and a CCU illustrated in FIG. 24.

FIG. 25 is a block diagram illustrating examples of functional configurations of the camera head 11102 and the CCU 11201 illustrated in FIG. 24.

The camera head 11102 includes a lens unit 11401, an image pickup unit 11402, a driving unit 11403, a communication unit 11404, and a camera head controlling unit 11405. The CCU 11201 includes a communication unit 11411, an image processing unit 11412, and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G, and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. Note that, in a case where the image pickup unit 11402 is configured as that of the multi-plate type, a plurality of systems of the lens units 11401 is provided corresponding to the individual image pickup elements.

Furthermore, the image pickup unit 11402 is not necessarily provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Therefore, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

Furthermore, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated, and/or information that a magnification and a focal point of a picked up image are designated.

Note that the image pickup conditions such as the frame rate, exposure value, magnification or focal point described above may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Furthermore, the communication unit 11411 transmits a control signal for controlling driving of the camera head 11102 to the camera head 11102. The image signal and the control signal can be transmitted by electrical communication, optical communication, or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Furthermore, the control unit 11413 causes, on the basis of an image signal for which image processes have been performed by the image processing unit 11412, the display apparatus 11202 to display a picked up image on which the surgical region or the like appears. At that time, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color, and so forth of edges of objects included in a picked up image. When causing the display apparatus 11202 to display a picked up image, the control unit 11413 may cause various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication, or a composite cable ready for both the electrical communication and the optical communication.

Here, communication is performed by wired communication using the transmission cable 11400 in the illustrated example, but the communication between the camera head 11102 and the CCU 11201 may be performed by wireless communication.

An example of the endoscopic surgery system to which the technology according to the present disclosure can be applied has been described as above. The technology according to the present disclosure can be suitably applied to the image pickup unit 11402 provided in the camera head 11102 of the endoscope 11100 among the above-described configurations. Since the picked up image with high image quality can be obtained by applying the technology according to the present disclosure to the image pickup unit 11402, it is possible to provide the endoscope 11100 with high image quality.

Although the embodiments of the present disclosure have been described as above, the technical scope of the present disclosure is not directly limited to the above-described embodiments, and various modifications can be made within the scope not departing from the gist of the present disclosure. Furthermore, components of different embodiments and modifications may be appropriately combined.

Furthermore, the effects in each of the embodiments described in the present specification are merely examples and are not limited, and other effects may be present.

Note that the present technology can also have the following configurations.

(1)

A solid-state imaging apparatus including:
a photoelectric conversion unit including a material having a smaller band gap energy than silicon; and
a circuit board joined to the photoelectric conversion unit, in which the circuit board includes:
  a pixel signal generation circuit that generates a pixel signal having a voltage value corresponding to a charge generated in the photoelectric conversion unit; and
  a thermometer circuit that detects a temperature of the circuit board.

(2)

The solid-state imaging apparatus according to the above (1), in which
the pixel signal generation circuit is arranged in a first region on a first surface of the circuit board, and
the photoelectric conversion unit is joined to the first region of the circuit board.

(3)

The solid-state imaging apparatus according to the above (2), in which
the thermometer circuit is formed in a region other than the first region on the first surface of the circuit board.

(4)

The solid-state imaging apparatus according to the above (2) or (3), in which
the circuit board includes a second region which is located around the first region on the first surface of the circuit board and in which a logic circuit that processes the pixel signal is arranged, and
the thermometer circuit is arranged in a vicinity of the second region.

(5)

The solid-state imaging apparatus according to the above (4), in which
the thermometer circuit is arranged between the first region and the second region.

(6)

The solid-state imaging apparatus according to any one of the above (1) to (5), further including
a conversion circuit that converts an analog signal output from the thermometer circuit into a digital signal.

(7)

The solid-state imaging apparatus according to any one of the above (1) to (6), in which
the photoelectric conversion unit includes a compound semiconductor.

(8)

The solid-state imaging apparatus according to any one of the above (1) to (7), in which
the photoelectric conversion unit contains at least one of InGaP, InAlP, InGaAs, InAlAs, a compound semiconductor having a chalcopyrite structure, amorphous silicon, germanium, a quantum dot photoelectric conversion film, or an organic photoelectric conversion film.

(9)

The solid-state imaging apparatus according to any one of the above (1) to (8), in which
the thermometer circuit includes at least one of a silicon diode or a PNP transistor.

(10)

The solid-state imaging apparatus according to any one of the above (1) to (9), including
a plurality of the thermometer circuits.

(11)

A solid-state imaging apparatus including:
a photoelectric conversion unit including a material having sensitivity to light having a wavelength of 1200 nanometers (nm) or more; and
a circuit board joined to the photoelectric conversion unit, in which the circuit board includes:
  a pixel signal generation circuit that generates a pixel signal having a voltage value corresponding to a charge generated in the photoelectric conversion unit; and
  a thermometer circuit that detects a temperature of the circuit board.

(12)

An imaging apparatus including:
the solid-state imaging apparatus according to the above (1) or (11); and
a package that accommodates the solid-state imaging apparatus.

(13)

The imaging apparatus according to the above (12), further including
a temperature control element that is arranged in the package and arranged on a side of a second surface of the circuit board opposite to the first surface on which the pixel signal generation circuit and the thermometer circuit are arranged.

(14)

The imaging apparatus according to the above (13), in which
the thermometer circuit is arranged in a region overlapping the temperature control element in a direction perpendicular to the first surface.

(15)

The imaging apparatus according to the above (13) or (14), in which
the temperature control element is a Peltier element.

(16)

An imaging system including:
an imaging apparatus including the solid-state imaging apparatus according to the above (1) or (11), and a temperature control element for controlling a temperature of the solid-state imaging apparatus;
a temperature control apparatus that controls the temperature control element; and
a controlling apparatus that controls the solid-state imaging apparatus and the temperature control apparatus,
in which the controlling apparatus controls the temperature control apparatus on the basis of the temperature detected by the thermometer circuit.

(17)

The imaging system according to the above (16), in which
the solid-state imaging apparatus further includes a conversion circuit that converts an analog signal output from the thermometer circuit into a digital signal,
the imaging apparatus further includes a package that accommodates the solid-state imaging apparatus and the temperature control element,
the package includes a terminal for transmitting or receiving a digital signal between the solid-state imaging apparatus and the controlling apparatus, and
the solid-state imaging apparatus transmits the digital signal to the controlling apparatus through the terminal.

(18)

The imaging system according to the above (17), in which
the solid-state imaging apparatus and the controlling apparatus are connected through an inter-integrated circuit (I2C) or a serial peripheral interface (SPI).

REFERENCE SIGNS LIST

1 Solid-state imaging apparatus
10 Pixel array unit
11, 11R, 11G, 11B Sensor pixel
12 Pixel drive line
13 Vertical signal line
14 Pixel circuit
15 Readout circuit
16 System control circuit
17 Film voltage control unit
18 Voltage generation circuit
20 Vertical drive circuit
21 n-type semiconductor film (InGaAs)
21A Semiconductor layer
22 p-type semiconductor layer
22A Diffusion region
23 n-type semiconductor layer
24 n-type semiconductor layer
25 Antireflection film
26 Color filter
26R, 26G, 26B Filter
27 On-chip lens
28 Passivation layer
29 Insulating layer
29A, 29B, 35A, 35B Interlayer insulating film
30 Horizontal drive circuit
31 Connection electrode
32 Bump electrode
32D Dummy electrode
33 Conductive film
35 Wiring layer
36 Buried layer
37H Opening
38 Pad electrode
40 Horizontal selection circuit
40A Horizontal circuit
40$a$ ADC
40$b$ Switch element
40$c$ Horizontal signal line
41 Support substrate
42 Interlayer insulating layer
43 Connection layer
43D Dummy connection layer
44 Readout electrode
45 Pixel signal generation circuit
46 Wiring
50 Package
51 Adhesive
54, 55 Wire
60 Lid with sealing glass
61 Sealing glass
62 Ceramic frame
63 Metal portion
70 Package substrate
71 Cavity
72, 73 Pin-like terminal
74, 91, 92 Bonding pad
75 Seal ring
80 Peltier element
81 First ceramic substrate
82 First copper electrode
85 Second ceramic substrate
86 Second copper electrode
87 P-type thermoelectric semiconductor
88 N-type thermoelectric semiconductor
90 Ceramic interposer substrate
100 Light receiving board (InGaAs substrate)
100A Light receiving surface
120 Thermometer circuit
121 AD conversion circuit
133 Terminal
200 Circuit board
200A Pixel signal generation circuit region
200B Peripheral circuit region
1000 Imaging system
1100 Sensor package
1200 FPGA
1300 Temperature controller
1400 Temperature control apparatus
AMP Amplification transistor
FD Floating diffusion
OFG Discharge transistor
PD Photodiode
RST Reset transistor
SEL Selection transistor
TRG Transfer transistor

The invention claimed is:
1. A solid-state imaging apparatus, comprising:
a photoelectric conversion unit including a material having a smaller band gap energy than silicon;
and a circuit board joined to the photoelectric conversion unit,
wherein the circuit board includes:
a pixel signal generation circuit that generates a pixel signal having a voltage value corresponding to a charge generated in the photoelectric conversion unit;

and a thermometer circuit that detects a temperature of the circuit board,
wherein the pixel signal generation circuit is arranged in a first region on a first surface of the circuit board,
wherein the photoelectric conversion unit is joined to the first region of the circuit board,
and wherein the thermometer circuit is formed in a region other than the first region on the first surface of the circuit board.

2. The solid-state imaging apparatus according to claim 1, further comprising
a conversion circuit that converts an analog signal output from the thermometer circuit into a digital signal.

3. The solid-state imaging apparatus according to claim 1, wherein
the photoelectric conversion unit includes a compound semiconductor.

4. The solid-state imaging apparatus according to claim 1, wherein
the photoelectric conversion unit contains at least one of InGaP, InAlP, InGaAs, InAlAs, a compound semiconductor having a chalcopyrite structure, amorphous silicon, germanium, a quantum dot photoelectric conversion film, or an organic photoelectric conversion film.

5. The solid-state imaging apparatus according to claim 1, wherein
the thermometer circuit includes at least one of a silicon diode or a PNP transistor.

6. The solid-state imaging apparatus according to claim 1, comprising
a plurality of thermometer circuits.

7. A solid-state imaging apparatus, comprising:
a photoelectric conversion unit including a material having a smaller band gap energy than silicon;
and a circuit board joined to the photoelectric conversion unit,
wherein the circuit board includes:
a pixel signal generation circuit that generates a pixel signal having a voltage value corresponding to a charge generated in the photoelectric conversion unit;
and a thermometer circuit that detects a temperature of the circuit board,
wherein the pixel signal generation circuit is arranged in a first region on a first surface of the circuit board,
wherein the photoelectric conversion unit is joined to the first region of the circuit board,
wherein the circuit board includes a second region which is located around the first region on the first surface of the circuit board and in which a logic circuit that processes the pixel signal is arranged,
and wherein the thermometer circuit is arranged in a vicinity of the second region.

8. The solid-state imaging apparatus according to claim 7, wherein the thermometer circuit is arranged between the first region and the second region.

9. An imaging apparatus, comprising:
a solid-state imaging apparatus, including:
a photoelectric conversion unit including a material having a smaller band gap energy than silicon; and
a circuit board joined to the photoelectric conversion unit,
wherein the circuit board includes:
a pixel signal generation circuit that generates a pixel signal having a voltage value corresponding to a charge generated in the photoelectric conversion unit; and
a thermometer circuit that detects a temperature of the circuit board;
a package that accommodates the solid-state imaging apparatus; and
a temperature control element that is arranged in the package and arranged on a side of a second surface of the circuit board opposite to a first surface on which the pixel signal generation circuit and the thermometer circuit are arranged.

10. The imaging apparatus according to claim 9, wherein the thermometer circuit is arranged in a region overlapping the temperature control element in a direction perpendicular to the first surface.

11. The imaging apparatus according to claim 9, wherein the temperature control element is a Peltier element.

12. An imaging system, comprising:
a solid-state imaging apparatus, including:
a photoelectric conversion unit including a material having a smaller band gap energy than silicon; and
a circuit board joined to the photoelectric conversion unit,
wherein the circuit board includes:
a pixel signal generation circuit that generates a pixel signal having a voltage value corresponding to a charge generated in the photoelectric conversion unit; and
a thermometer circuit that detects a temperature of the circuit board, and
a temperature control element for controlling a temperature of the solid-state imaging apparatus;
a temperature control apparatus that controls the temperature control element; and
a controlling apparatus that controls the solid-state imaging apparatus and the temperature control apparatus,
wherein the controlling apparatus controls the temperature control apparatus on a basis of the temperature detected by the thermometer circuit.

13. The imaging system according to claim 12, wherein
the solid-state imaging apparatus further includes a conversion circuit that converts an analog signal output from the thermometer circuit into a digital signal,
the imaging apparatus further includes a package that accommodates the solid-state imaging apparatus and the temperature control element,
the package includes a terminal for transmitting or receiving a digital signal between the solid-state imaging apparatus and the controlling apparatus, and
the solid-state imaging apparatus transmits the digital signal to the controlling apparatus through the terminal.

14. The imaging system according to claim 13, wherein the solid-state imaging apparatus and the controlling apparatus are connected through an inter-integrated circuit (I2C) or a serial peripheral interface (SPI).

* * * * *